(12) United States Patent
Uematsu et al.

(10) Patent No.: US 12,120,781 B2
(45) Date of Patent: Oct. 15, 2024

(54) METHOD OF MANUFACTURING HOLDING DEVICE, METHOD OF MANUFACTURING STRUCTURE FOR HOLDING DEVICE, AND HOLDING DEVICE

(71) Applicant: NGK SPARK PLUG CO., LTD., Nagoya (JP)

(72) Inventors: Hideki Uematsu, Nagoya (JP); Junji Suzuki, Nagoya (JP); Kazuki Izumihara, Nagoya (JP); Yuji Kawamura, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 961 days.

(21) Appl. No.: 17/257,406

(22) PCT Filed: Mar. 27, 2020

(86) PCT No.: PCT/JP2020/013967
§ 371 (c)(1),
(2) Date: Dec. 31, 2020

(87) PCT Pub. No.: WO2020/213368
PCT Pub. Date: Oct. 22, 2020

(65) Prior Publication Data
US 2021/0274599 A1    Sep. 2, 2021

(30) Foreign Application Priority Data

Apr. 16, 2019 (JP) .................................. 2019-077505

(51) Int. Cl.
*H05B 3/03* (2006.01)
*H01L 21/683* (2006.01)
(Continued)

(52) U.S. Cl.
CPC ........... *H05B 3/03* (2013.01); *H01L 21/6833* (2013.01); *H05B 1/0233* (2013.01); *H05B 3/06* (2013.01);
(Continued)

(58) Field of Classification Search
CPC . H05B 3/03; H05B 3/06; H05B 3/283; H05B 3/265; H05B 3/748; H05B 1/0233;
(Continued)

(56) References Cited

U.S. PATENT DOCUMENTS 6,035,101 A * 3/2000 Sajoto ............... H01L 21/67109
219/390
2009/0130825 A1 * 5/2009 Nakamura ........ H01L 21/67103
118/500
(Continued)

FOREIGN PATENT DOCUMENTS

| JP | 2005-071916 A | 3/2005 |
| JP | 2006-054125 A | 2/2006 |

(Continued)

OTHER PUBLICATIONS

Japan Patent Office, International Search Report issued in corresponding Application No. PCT/JP2020/013967, mailed Jun. 16, 2020.

*Primary Examiner* — Shawntina T Fuqua
(74) *Attorney, Agent, or Firm* — Stites & Harbison, PLLC; Jeffrey A. Haeberlin

(57) ABSTRACT

A holding device that holds an object on a first surface of a first portion of a plate-shaped member includes a heater pattern formed on a ceramic green sheet and a cover layer covering the heater pattern. A second portion of the plate-shaped member and a heater electrode are manufactured by firing a layered body constituted by a plurality of ceramic green sheets. A second joining portion joins the second
(Continued)

portion and a base member. A temperature distribution of a second surface of the second portion is measured while cooling with a cooling mechanism of the base member and supplying power to the heater electrode. Based on a result of the measurement, an electrical resistance of the heater electrode is adjusted by removing a portion of the heater electrode together with the cover layer. A first joining portion joins the second portion and the first portion of the plate-shaped member.

6 Claims, 14 Drawing Sheets

(51) Int. Cl.
  *H05B 1/02* (2006.01)
  *H05B 3/06* (2006.01)
  *H05B 3/26* (2006.01)
(52) U.S. Cl.
  CPC ....... *H05B 3/265* (2013.01); *H05B 2203/017* (2013.01)

(58) Field of Classification Search
  CPC .......... H05B 2203/017; H01L 21/6833; H01L 21/67109; H01L 21/6831; H01L 21/67103; H01L 21/68757; H02N 13/00; B23Q 3/15
  See application file for complete search history.

(56) References Cited

U.S. PATENT DOCUMENTS

2019/0244795 A1* 8/2019 Tandou ............. H01L 21/67103
2022/0189812 A1* 6/2022 Takebayashi .......... H05B 3/283

FOREIGN PATENT DOCUMENTS

| JP | 2006-066742 A | 3/2006 | |
| JP | 2006-228633 A | 8/2006 | |
| JP | 2021197457 A * | 12/2021 | ........ H01J 37/32724 |
| KR | 20240052914 A * | 4/2021 | |
| WO | 2016/143063 A1 | 9/2016 | |

* cited by examiner

METHOD OF MANUFACTURING HOLDING DEVICE, METHOD OF MANUFACTURING STRUCTURE FOR HOLDING DEVICE, AND HOLDING DEVICE

TECHNICAL FIELD

The technology that is disclosed in the present description relates to a method of manufacturing a holding device that holds an object, a method of manufacturing a structure for the holding device, and the holding device.

BACKGROUND ART

For example, as a holding device that holds a wafer when manufacturing a semiconductor device, an electrostatic chuck is used. The electrostatic chuck includes a plate-shaped member including a portion made of a ceramic, a base member made of, for example, a metal, a joining portion that joins the plate-shaped member and the base member to each other, and a chuck electrode disposed inside the plate-shaped member. By utilizing an electrostatic attraction force that is generated by applying a voltage to the chuck electrode, the wafer is attracted to and held on a surface (hereunder referred to as "attraction surface") of the plate-shaped member.

When the temperature of the wafer held on the attraction surface of the electrostatic chuck does not become a desired temperature, the precision with which each processing operation (deposition, etching, etc.) is performed on the wafer may be reduced. Therefore, the electrostatic chuck is required to have the ability to control the temperature distribution of the wafer. Consequently, the temperature distribution of the attraction surface of the plate-shaped member (and thus the temperature distribution of the wafer held on the attraction surface) is controlled by heating with a heater electrode that is a resistance heater disposed inside the plate-shaped member or by cooling by supplying a refrigerant to a refrigerant flow path formed in the base member.

Hitherto, for manufacturing a holding device that holds a wafer, the following technology has been known. In the technology, after a resistance heater has been formed on a surface of a plate-shaped ceramic sintered body, the resistance of the resistance heater is adjusted by removing a portion of the resistance heater by laser processing or mechanical processing, and then a ceramic molded product is stacked on a surface of the ceramic sintered body on which the resistance heater has been formed to fire the ceramic sintered body, the resistance heater, and the ceramic molded product together (refer to, for example, Patent Literature 1).

CITATION LIST

Patent Literature

PATENT LITERATURE 1: JP2006-228633A

SUMMARY OF INVENTION

Technical Problem

The technology of the related art above is a technology that increases the controllability of the temperature distribution of the surface that holds the wafer by adjusting the resistance of the resistance heater. However, in the electrostatic chuck, since the temperature distribution of the attraction surface that holds the wafer is influenced by the precision of the base member and the precision of the joining portion in addition to the precision of the heater electrode (resistance heater), merely adjusting the resistance of the resistance heater does not make it possible to sufficiently increase the controllability of the temperature distribution of the attraction surface that holds the wafer.

Note that such a problem is a problem that is common not only to electrostatic chucks, but also to general holding devices that include a plate-shaped member, a base member, and a joining portion, and that hold an object on a surface of the plate-shaped member.

The present description discloses a technology that makes it possible to solve the problem described above.

Solution to Problem

The technology that is disclosed in the present description can be realized in, for example, the following aspects.

(1) A method of manufacturing a holding device, which is disclosed in the present description, is a method of manufacturing a holding device that holds an object on a first surface of a plate-shaped member, the holding device including the plate-shaped member that has the first surface and a second surface on a side opposite to the first surface, the plate-shaped member including a first portion that includes the first surface, a second portion that includes the second surface and a portion made of a ceramic, and a first joining portion that joins the first portion and the second portion to each other; a heater electrode that is disposed at the second portion of the plate-shaped member and that is formed from a resistance heater; a base member that has a third surface, that is disposed so that the third surface is positioned on a side of the second surface of the plate-shaped member, and that includes a cooling mechanism; and a second joining portion that is disposed between the second surface of the plate-shaped member and the third surface of the base member, and that joins the plate-shaped member and the base member to each other. The method of manufacturing the holding device includes a forming step of forming a heater pattern on a first ceramic green sheet by using a heater material that is a material for forming the heater electrode; a disposing step of disposing a cover layer on the first ceramic green sheet, the cover layer being made of an insulating material and covering the heater pattern; a firing step of firing a layered body constituted by a plurality of ceramic green sheets, including the first ceramic green sheet, that are stacked upon each other, to manufacture the second portion of the plate-shaped member and the heater electrode; a first joining step of joining the second portion of the plate-shaped member and the base member to each other by using the second joining portion; a temperature measuring step of measuring a temperature distribution of a surface of the second portion of the plate-shaped member on a side opposite to a surface of the second portion facing the second joining portion, while cooling is performed with the cooling mechanism and electric power is supplied to the heater electrode; an adjusting step of, based on a result of measurement of the temperature distribution, adjusting an electrical resistance of the heater electrode by removing a portion of the heater electrode covered by the cover layer together with the cover layer; and a second joining step of joining the second portion and the first portion of the plate-shaped member to each other by using the first joining portion.

In the method of manufacturing the holding device, with the base member joined to the second portion that is a portion of the plate-shaped member on the side of the second surface and that is a portion at which the heater electrode is disposed, the temperature distribution of the surface of the second portion is measured while cooling is performed with the cooling mechanism of the base member and electric power is supplied to the heater electrode. Based on the result of measurement of the temperature distribution, a portion of the heater electrode covered by the cover layer is removed together with the cover layer to adjust the electrical resistance of the heater electrode and to subsequently join the first portion to the second portion of the plate-shaped member to each other. That is, in the method of manufacturing the holding device, after a portion on a side of the base member with respect to the heater electrode has been formed, in a state that is the same as that at the time of actual use (that is, in a state in which cooling has been performed with the cooling mechanism of the base member and electric power has been supplied to the heater electrode), it is possible to measure the temperature distribution of the surface of the second portion of the plate-shaped member and to adjust the electrical resistance of the heater electrode based on the result of measurement of the temperature distribution. Therefore, according to the method of manufacturing the holding device, it is possible to precisely adjust the electrical resistance of the heater electrode in a short time, as a result of which it is possible to increase the controllability of the temperature distribution of the first surface of the plate-shaped member. Further, in the method of manufacturing the holding device, since firing is performed with the pattern of the heater material, which is the material for forming the heater electrode, being covered by the cover layer, it is possible to suppress deterioration (for example, volatilization and sublimation) of the pattern of the heater material at the time of the firing and to suppress a reduction in the controllability of the temperature distribution of the first surface of the plate-shaped member caused by variations in the resistance of the heater electrode due to the deterioration of the pattern of the heater material.

(2) The method of manufacturing the holding device above may further include a filling step of filling with an insulator a portion at which removal has been performed in the adjusting step. According to the method of manufacturing the holding device, it is possible to suppress entry of a gas into the plate-shaped member while preventing a short circuit between heater electrodes.

(3) In the method of manufacturing the holding device above, a first hole may be formed in the cover layer that is disposed in the disposing step, the first hole extending through the cover layer in a thickness direction, and the method of manufacturing the holding device may further include, after the firing step, a thickness measuring step of measuring a thickness of the cover layer at a position of the first hole. According to the method of manufacturing the holding device, based on the thickness of the cover layer, it is possible to properly set the removal depth of the cover layer and the removal depth of the heater electrode in the adjusting step and to precisely adjust the electrical resistance of the heater electrode, as a result of which it is possible to effectively increase the controllability of the temperature distribution of the first surface of the plate-shaped member.

(4) The method of manufacturing the holding device above may further include at least one of, after the firing step, a first warp correcting step of correcting a warp of the second portion of the plate-shaped member by heating the second portion while applying a load to the second portion and, after the firing step, a second warp correcting step of correcting the warp of the second portion by polishing the cover layer. According to the method of manufacturing the holding device, by performing at least one of the first warp correcting step and the second warp correcting step, it is possible to correct the warp of the second portion and to effectively reduce the warp of the second portion and thus the warp of the plate-shaped member. In the method of manufacturing the holding device, when correcting the warp of the second portion, since the heater electrode is covered by the cover layer, it is possible to suppress a reduction in the controllability of the temperature distribution of the first surface of the plate-shaped member caused by variations in the resistance of the heater electrode caused by deterioration of the heater electrode due to the heater electrode reacting with a warp correction jig.

(5) The method of manufacturing the holding device above may include both the first warp correcting step and the second warp correcting step that is performed after the first warp correcting step. According to the method of manufacturing the holding device, the warp of the second portion that could not be completely corrected even in the first warp correcting step can be corrected in the second warp correcting step of polishing the cover layer, and the warp of the second portion and thus the warp of the plate-shaped member can be effectively reduced. In the method of manufacturing the holding device, when correcting the warp of the second portion, since the heater electrode is covered by the cover layer, it is possible to suppress a reduction in the controllability of the temperature distribution of the first surface of the plate-shaped member caused by variations in the resistance of the heater electrode caused by deterioration of the heater electrode due to the heater electrode reacting with a warp correction jig.

(6) In the method of manufacturing the holding device above, the forming step may include forming a reference pattern on the first ceramic green sheet by using a predetermined material, a second hole may be formed in the cover layer at a position that overlaps the reference pattern, the cover layer being disposed in the disposing step, the second hole extending through the cover layer in a thickness direction, and, in the adjusting step, a removal position on the heater electrode may be set with reference to a position of the reference pattern, the reference pattern being exposed through the second hole formed in the cover layer. According to the method of manufacturing the holding device, by setting the removal position with reference to the position of the reference pattern, it is possible to precisely remove the heater electrode and to precisely adjust the electrical resistance of the heater electrode, as a result of which it is possible to effectively increase the controllability of the temperature distribution of the first surface of the plate-shaped member.

(7) The method of manufacturing the holding device above may further include, after the firing step, a thickness measuring step of measuring a thickness of the cover layer at a position of the second hole. According to the method of manufacturing the holding device, since it is possible to measure the thickness of the cover layer by utilizing the hole formed in the cover layer for exposing the reference pattern, it is possible to reduce the number of holes that are formed in the cover layer and to suppress a reduction in the controllability of the temperature distribution of the first surface of the plate-shaped member caused by the existence of the holes.

(8) In the method of manufacturing the holding device above, a thermal resistance of the first joining portion may be lower than a thermal resistance of the second joining portion. According to the method of manufacturing the holding device, it is possible to suppress a reduction in the responsivity to heating and/or cooling in the plate-shaped member caused by the existence of the first joining portion and to suppress a reduction in the controllability of the temperature distribution of the first surface of the plate-shaped member.

(9) In the method of manufacturing the holding device above, the second joining step may be a step of forming the first joining portion by using heat generated by supplying electric power to the heater electrode. According to the method of manufacturing the holding device, compared with the method of heating the entire device when forming the first joining portion, it is possible to suppress adverse effects on other members resulting from the heating (for example, variations in heat conductivity caused by partial peeling of the second joining portion) and to suppress a reduction in the controllability of the temperature distribution of the first surface of the plate-shaped member.

(10) A method of manufacturing a structure for a holding device, which is disclosed in the present description, is a method of manufacturing a structure for a holding device that holds an object above a particular member, the structure including the particular member that includes a particular surface and a portion made of a ceramic; a heater electrode that is disposed at the particular member and formed from a resistance heater; a base member that includes a cooling mechanism; and a joining portion that is disposed between the particular surface of the particular member and the base member and that joins the particular member and the base member to each other. The method of manufacturing the structure for the holding device includes a preparing step of preparing a prior-to-adjustment structure that includes the particular member, the heater electrode covered by a cover layer that is a portion of the particular member, the base member, and the joining portion that joins the particular member and the base member to each other; a temperature measuring step of measuring a temperature distribution of a surface of the particular member on a side opposite to the particular surface, while cooling is performed with the cooling mechanism and electric power is supplied to the heater electrode; and an adjusting step of, based on a result of measurement of the temperature distribution, adjusting an electrical resistance of the heater electrode by removing a portion of the heater electrode covered by the cover layer together with the cover layer.

In the method of manufacturing the structure for the holding device, with the base member joined to the particular member at which the heater electrode is disposed, the temperature distribution of the surface of the particular member is measured while cooling is performed with the cooling mechanism of the base member and electric power is supplied to the heater electrode. Based on the result of measurement of the temperature distribution, the electrical resistance of the heater electrode is adjusted by removing a portion of the heater electrode covered by the cover layer together with the cover layer to adjust the electrical resistance of the heater electrode. That is, in the method of manufacturing the structure for the holding device, after a portion on the side of the base member with respect to the heater electrode has been prepared, in a state that is the same as that at the time of actual use (that is, in a state in which cooling has been performed with the cooling mechanism of the base member and electric power has been supplied to the heater electrode), it is possible to measure the temperature distribution of the surface of the particular member and to adjust the electrical resistance of the heater electrode based on the result of measurement of the temperature distribution. Therefore, according to the method of manufacturing the structure for the holding device, it is possible to precisely adjust the electrical resistance of the heater electrode in a short time, as a result of which it is possible to increase the controllability of the temperature distribution of an object holding surface of the holding device that is formed by using the structure for the holding device.

(11) A holding device that is disclosed in the present description is a holding device that holds an object on a first surface of a plate-shaped member and that includes the plate-shaped member that has the first surface substantially orthogonal to a first direction and a second surface on a side opposite to the first surface, the plate-shaped member including a first portion that includes the first surface, a second portion that includes the second surface and a portion made of a ceramic, and a first joining portion that joins the first portion and the second portion to each other; a heater electrode that is disposed at the second portion of the plate-shaped member and that is formed from a resistance heater; a base member that has a third surface, that is disposed so that the third surface is positioned on a side of the second surface of the plate-shaped member, and that includes a cooling mechanism; and a second joining portion that is disposed between the second surface of the plate-shaped member and the third surface of the base member, and that joins the plate-shaped member and the base member to each other. A groove at which a portion of a surface defining the groove is constituted by a portion of a surface of the heater electrode is formed in a fourth surface among surfaces of the second portion of the plate-shaped member, the fourth surface being a surface facing the first joining portion, and when electric power is supplied to the heater electrode and cooling is performed with the cooling mechanism, and when a difference between a temperature of the heater electrode and a temperature of the cooling is greater than or equal to 50° C., a difference between a maximum value and a minimum value of a temperature at the first surface is less than or equal to 3.5° C. According to the holding device, since the temperature difference between each position on the first surface of the plate-shaped member is very small, it is possible to effectively increase the controllability of the temperature distribution of the first surface of the plate-shaped member.

(12) In the holding device, in at least one section that is parallel to the first direction, an edge portion defining an opening of the groove may have a round shape. According to the holding device, when, for example, manufacturing the holding device, it is possible to suppress the vicinity of the edge portion defining the opening of the groove in the second portion of the plate-shaped member from breaking.

(13) In the holding device, in at least one section that is parallel to the first direction, the groove may have a shape in which a depth of a deepest portion is deeper than a maximum value of a distance in the first direction from a portion of the fourth surface other than the groove to each position on a surface of the heater electrode. According to the holding device, even if a crack occurs with the deepest portion of the groove as a starting point, it is possible to prevent changes in the electrical resistance of the heater electrode caused by the crack reaching the inner portion of the heater electrode, as a result of which it is possible to prevent changes in the calorific value of the heater electrode and to further effectively increase the controllability of the temperature distribution of the first surface of the plate-shaped member.

(14) In the holding device, in at least one section that is parallel to the first direction, the groove may have a shape whose width in a direction orthogonal to the first direction becomes narrower with decreasing distance from a deep position. According to the holding device, compared with a structure in which the width of the groove is constant in a depth direction, in the vicinity of a surface of the heater electrode that constitutes a surface defining the groove, a portion at which the heater electrode does not exist becomes small, and, at a position on the surface of the heater electrode that constitutes the surface defining the groove, the electrical resistance (the calorific value) is suppressed from changing suddenly and deviations in the electrical resistance (the calorific value) of the heater electrode are reduced, and thus it is possible to further effectively increase the controllability of the temperature distribution of the first surface of the plate-shaped member.

(15) In the holding device, in at least one section that is parallel to the first direction, the groove may have a shape in which a line constituting a surface defining the groove has no more than one bending point. According to the holding device, it is possible to suppress concentration of stress at each position on the surface defining the groove, as a result of which it is possible to suppress occurrence of cracks with the surface defining the groove as a starting point.

(16) In the holding device, a portion of the first joining portion may exist in the groove. According to the holding device, since the portion of the first joining portion existing in the groove functions as an anchor, it is possible to increase the joining strength between the first portion and the second portion resulting from the first joining portion.

Note that the technology that is disclosed in the present description can be realized in various aspects, and can be realized in the aspect of, for example, a holding device, an electrostatic chuck, or a method of manufacturing the holding device or the electrostatic chuck.

DESCRIPTION OF EMBODIMENTS

A. Embodiment

A-1. Structure of Electrostatic Chuck 100

Figure 1:
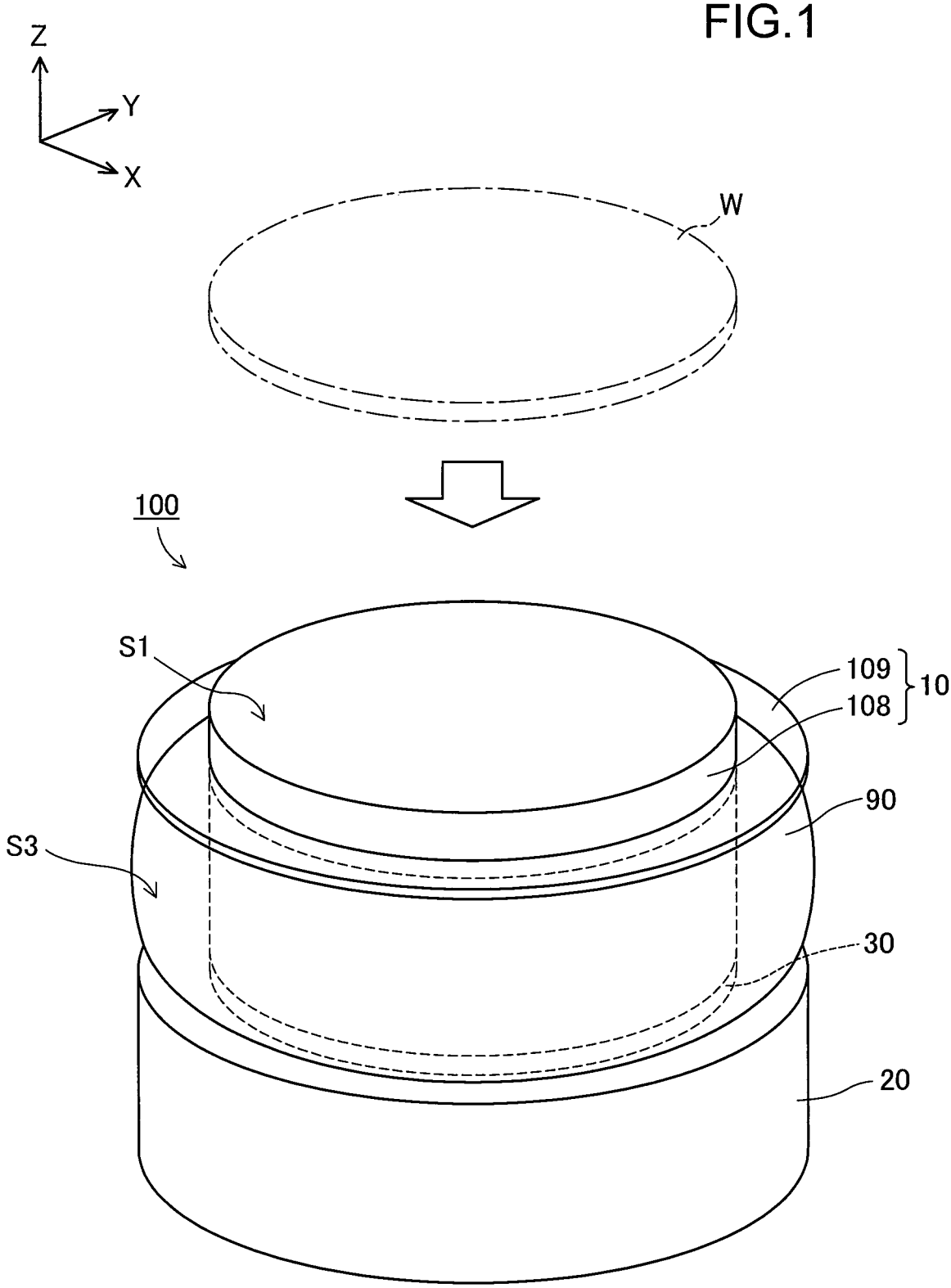
FIG. 1 is a perspective view schematically showing an external structure of an electrostatic chuck 100 in the present embodiment.
Figure 2:
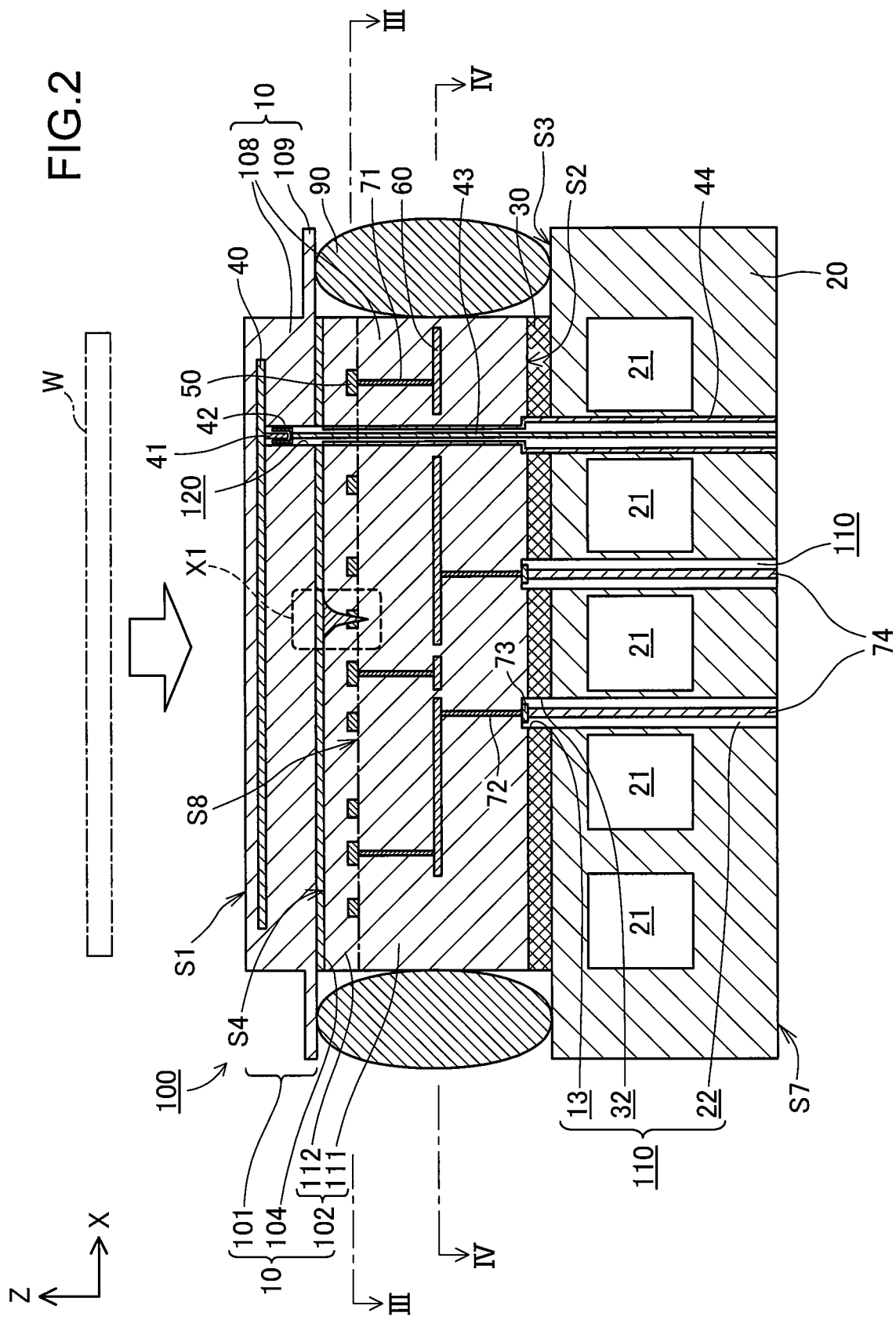
FIG. 2 is an explanatory view schematically showing a structure of an XZ section of the electrostatic chuck 100 in the present embodiment.
Figure 3:
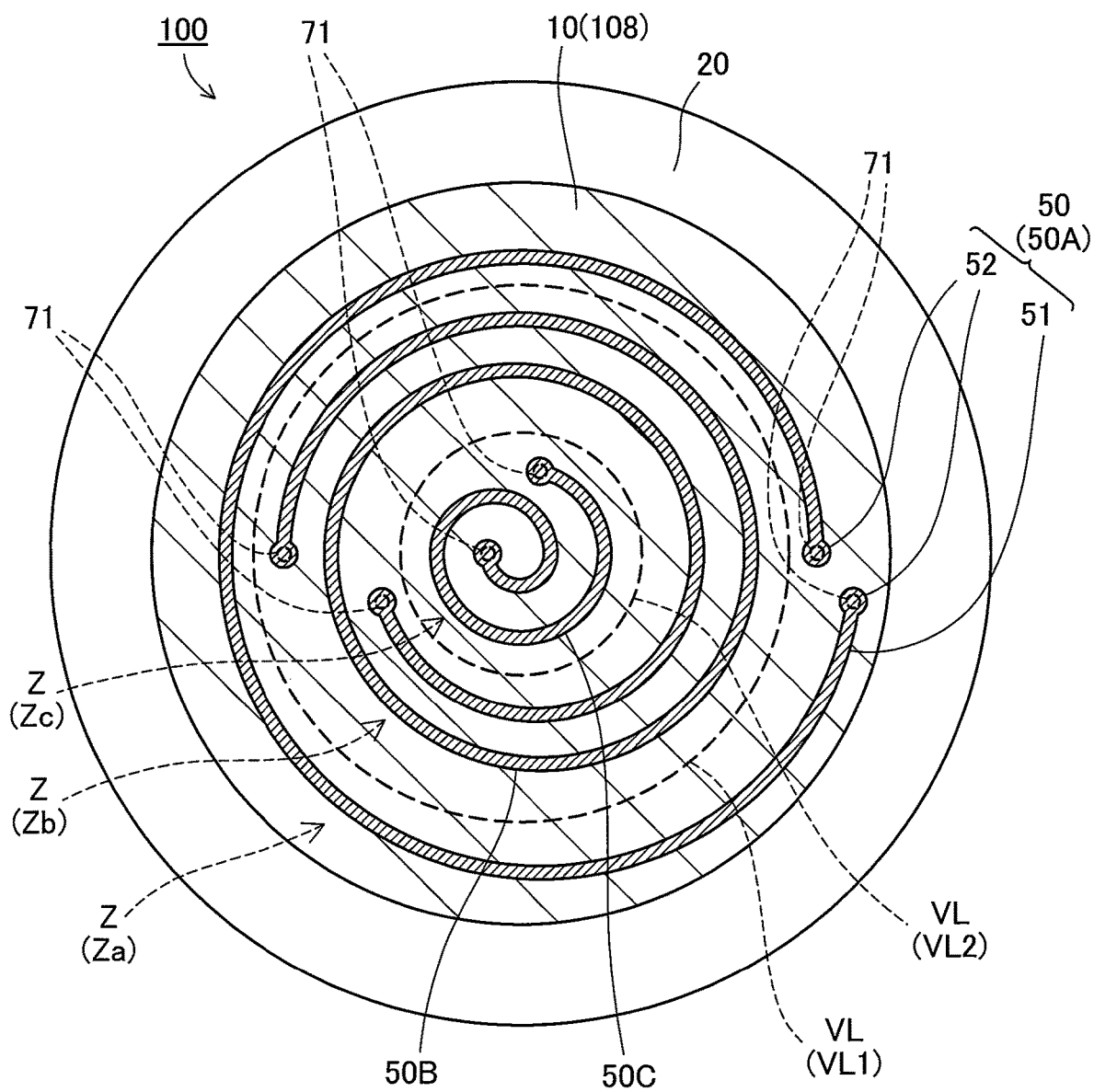
FIG. 3 is an explanatory view schematically showing a structure of an XY section of the electrostatic chuck 100 in the present embodiment.
Figure 4:
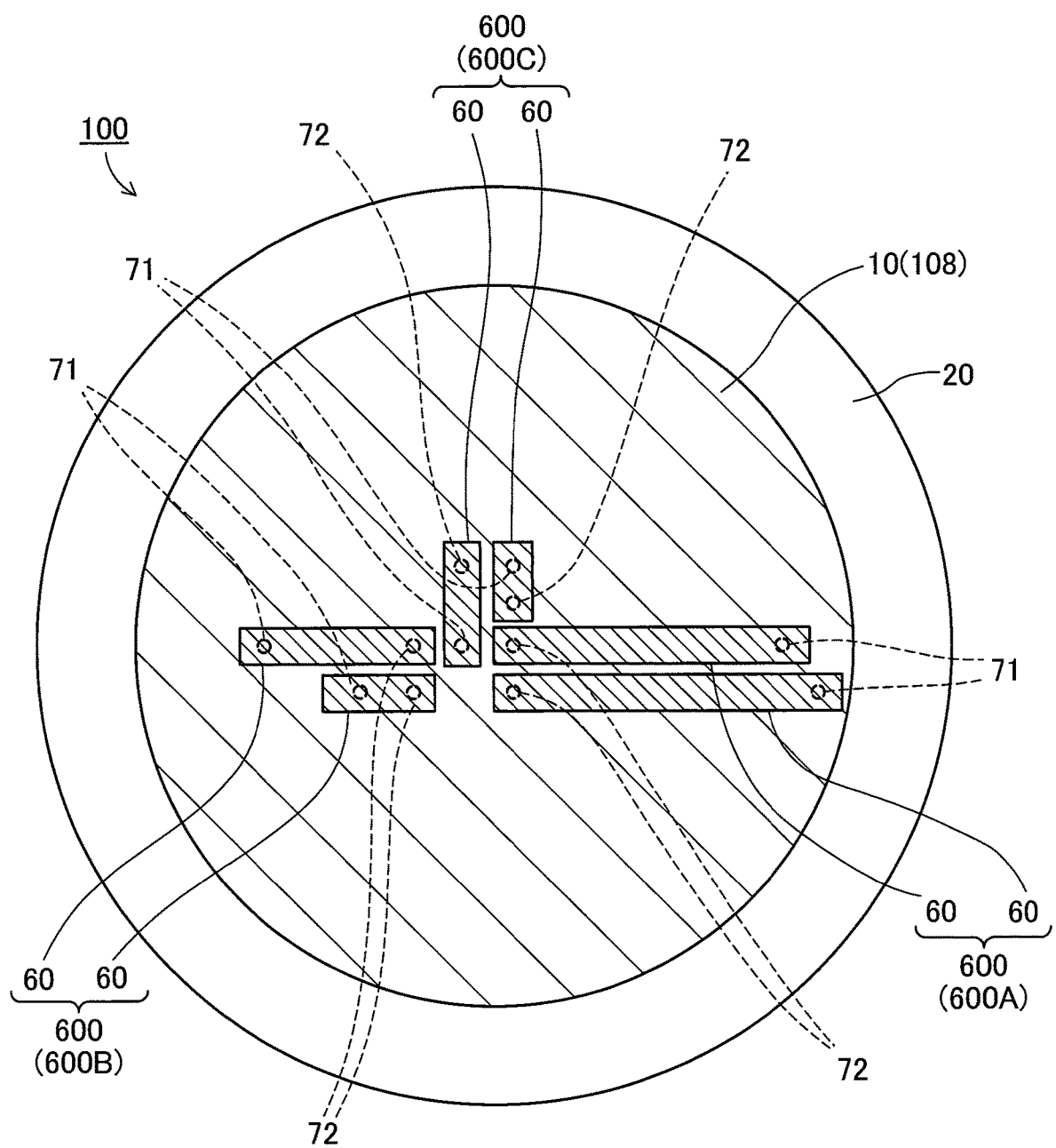
FIG. 4 is an explanatory view schematically showing a structure of an XY section of the electrostatic chuck 100 in the present embodiment.

FIG. 1 is a perspective view schematically showing an external structure of an electrostatic chuck 100 in the present embodiment. FIG. 2 is an explanatory view schematically showing a structure of an XZ section of the electrostatic chuck 100 in the present embodiment. FIGS. 3 and 4 are each an explanatory view schematically showing a structure of an XY section of the electrostatic chuck 100 in the present embodiment. FIG. 3 shows the structure of the XY section of the electrostatic chuck 100 at a position along III-III in FIG. 2. FIG. 4 shows the structure of the XY section of the electrostatic chuck 100 at a position along IV-IV in FIG. 2. Each figure shows XYZ axes that are orthogonal to each other for designating directions. In the present description, although, for convenience, a positive direction along the Z axis is called an upward direction and a negative direction along the Z axis is called a downward direction, the electrostatic chuck 100 may be actually set in an orientation differing from such orientations. In addition, in the present description, a direction orthogonal to the Z-axis direction is called a planar direction. The Z-axis direction is an example of a first direction in the claims.

The electrostatic chuck 100 is a device that holds an object (for example, a wafer W) by attracting the object by an electrostatic attraction force, and is used, for example, for fixing the wafer W in a vacuum chamber of a semiconductor manufacturing device. The electrostatic chuck 100 includes a plate-shaped member 10 and a base member 20 that are disposed side by side in a predetermined arrangement direction (in the present embodiment, in the up-down direction (Z-axis direction)). The plate-shaped member 10 and the base member 20 are disposed so that a lower surface S2 (see FIG. 2) of the plate-shaped member 10 and an upper surface S3 of the base member 20 face each other in the arrangement direction with a joining portion 30 (described later) interposed therebetween. That is, the base member 20 is disposed so that the upper surface S3 of the base member 20 is positioned on a side of the lower surface S2 of the plate-shaped member 10. The upper surface S3 of the base member 20 is an example of a third surface in the claims.

The plate-shaped member 10 is a substantially disc-shaped member having a substantially circular planar upper surface (hereunder referred to as "attraction surface") S1 substantially orthogonal to the aforementioned arrangement direction (the Z-axis direction), and a lower surface S2 on a side opposite to the attraction surface S1. In the present embodiment, the plate-shaped member 10 includes a collar section 109 protruding in the planar direction over the entire outer periphery. A portion of the plate-shaped member 10 excluding the collar section 109 is called a main body section 108 below. The diameter of the main body section 108 of the plate-shaped member 10 is, for example, approximately 50 mm to 500 mm (ordinarily, approximately 200 mm to 350 mm), and the thickness of the plate-shaped member 10 is, for example, approximately 1 mm to 10 mm. The attraction surface S1 of the plate-shaped member 10 is an example of a first surface in the claims, and the lower surface S2 of the plate-shaped member 10 is an example of a second surface in the claims.

As shown in FIG. 2, in the present embodiment, the plate-shaped member 10 is constituted by an upper portion 101, a lower portion 102, and an intermediate joining portion 104 that joins the upper portion 101 and the lower portion 102 to each other.

The lower portion 102 of the plate-shaped member 10 is a substantially flat-plate-shaped portion of the plate-shaped member 10 including the lower surface S2 of the plate-shaped member 10. The lower portion 102 is constituted by a substrate layer 111 and a cover layer 112. The substrate layer 111 is a substantially flat-plate-shaped portion of the lower portion 102 including the lower surface S2 of the plate-shaped member 10, and the cover layer 112 is a substantially flat-plate-shaped portion of the lower portion 102 including an upper surface S4 (a surface facing the intermediate joining portion 104) of the lower portion 102. In the present embodiment, the substrate layer 111 and the cover layer 112 constituting the lower portion 102 of the plate-shaped member 10 are both formed from a sintered body made of a ceramic (for example, alumina or aluminum nitride). The lower portion 102 of the plate-shaped member 10 is an example of a second portion in the claims, and the upper surface S4 of the lower portion 102 is an example of a fourth surface in the claims.

The upper portion 101 of the plate-shaped member 10 is a substantially flat-plate-shaped portion of the plate-shaped member 10 including the attraction surface S1. The collar section 109 is formed at the upper portion 101. In the present description, the upper portion 101 of the plate-shaped member 10 is formed from a sintered body made of a ceramic (for example, alumina or aluminum nitride). It is desirable that the upper portion 101 be made of a ceramic material that has a plasma resistance that is higher than the plasma resistance of the material of the lower portion 102 and that has a porosity that is lower than the porosity of the lower portion 102. The upper portion 101 is an example of a first portion in the claims.

The intermediate joining portion 104 of the plate-shaped member 10 is constituted by, for example, an adhesive, such as a silicone-based resin, an acrylic resin, or an epoxy-based resin, glass, or a metal. The intermediate joining portion 104 may contain a filler, such as ceramic powder. The intermediate joining portion 104 is an example of a first joining portion in the claims.

As shown in FIG. 2, a chuck electrode 40 made of a conductive material (for example, tungsten, molybdenum, or platinum) is disposed in the plate-shaped member 10 (more specifically, in the upper portion 101 constituting the plate-shaped member 10). The shape of the chuck electrode 40 when viewed in the Z-axis direction is, for example, a substantially circular shape. The electrostatic chuck 100 has a structure for supplying electric power to the chuck electrode 40. Specifically, a hole 120 extending from a lower surface S7 of the base member 20 to an inner portion of the plate-shaped member 10 is formed. The hole 120 is an integrated hole formed by causing a through hole extending through the base member 20 in the up-down direction, a through hole extending through the joining portion 30 in the up-down direction, and a concave portion formed from the lower surface S2 of the plate-shaped member 10 to a lower surface of the chuck electrode 40 to communicate with each other. An insulating member 44 is disposed at an inner peripheral surface defining the hole 120 (in the embodiment, of the hole 120, an inner peripheral surface of a portion at which the base member 20, the joining portion 30, and the lower portion 102 of the plate-shaped member 10 are formed). An input pin 41 is connected to a portion of the lower surface of the chuck electrode 40 exposed from the hole 120. A connector 42 provided on a front end of a wire section 43 disposed in the hole 120 is fitted to the input pin 41. When a voltage is applied to the chuck electrode 40 through the wire section 43 and the input pin 41 from a power source (not shown), an electrostatic attraction force is generated and the wafer W is attracted and fixed to the attraction surface S1 of the plate-shaped member 10 by the electrostatic attraction force.

A plurality of heater electrodes 50 for controlling the temperature distribution of the attraction surface S1 of the plate-shaped member 10 (that is, the temperature distribution of the wafer W held on the attraction surface S1) and a structure for supplying electric power to each heater electrode 50 (such as driver electrodes 60) are disposed in the plate-shaped member 10 (more specifically, in the lower portion 102 constituting the plate-shaped member 10). These structures are described in detail later.

The base member 20 is, for example, a circular planar plate-shaped member having a diameter that is the same as or larger than the diameter of the main body section 108 of the plate-shaped member 10. The base member 20 is made of, for example, a metal (such as aluminum or an aluminum alloy). The diameter of the base member 20 is, for example, approximately 220 mm to 550 mm (ordinarily, 220 mm to 350 mm), and the thickness of the base member 20 is, for example, approximately 20 mm to 40 mm.

The base member 20 is joined to the plate-shaped member 10 by using the joining portion 30 disposed between the lower surface S2 of the plate-shaped member 10 and the upper surface S3 of the base member 20. The joining portion 30 is constituted by, for example, an adhesive, such as a silicone-based resin, an acrylic resin, or an epoxy-based resin. The joining portion 30 may contain a filler, such as ceramic powder. The thickness of the joining portion 30 is, for example, approximately 0.1 mm to 1 mm. It is desirable that the thermal resistance of the joining portion 30 be higher than the thermal resistance of the intermediate joining portion 104 (in other words, the thermal resistance of the intermediate joining portion 104 be lower than the thermal resistance of the joining portion 30). Here, the thermal resistance of the joining portion (the joining portion 30 or the intermediate joining portion 104) is expressed by $L/(\lambda \cdot S)$, where the thermal conductivity of the joining portion is $\lambda$, the sectional area of an XY section at the joining portion is S, and the thickness of the joining portion is L. The joining portion 30 is an example of a second joining portion in the claims.

The base member 20 includes a cooling mechanism. More specifically, a refrigerant flow path 21 is formed in the base member 20. When a refrigerant (for example, a fluorine-based inert liquid or water) is caused to flow in the refrigerant flow path 21, the base member 20 is cooled and the plate-shaped member 10 is cooled by heat transfer (heat conduction) between the base member 20 and the plate-shaped member 10 through the joining portion 30, and the wafer W held on the attraction surface S1 of the plate-shaped member 10 is cooled. Therefore, the temperature distribution of the wafer W is controlled.

The electrostatic chuck 100 includes a circular ring-shaped O ring 90 formed so as to surround an outer periphery of a layered body constituted by the lower portion 102 of the plate-shaped member 10 and the intermediate joining portion 104 and the joining portion 30. The O ring 90 is formed from, for example, an insulator made of, for example, rubber. The O ring 90 is in close contact with a lower surface of the collar section 109, formed at the upper portion 101, and the upper surface S3 of the base member 20, and prevents the joining portion 30 and the intermediate joining portion 104 from being exposed to plasma or the like and from deteriorating.

A-2. Structure of Heater Electrodes 50, Etc.

Next, the heater electrodes 50 and the structure for supplying electric power to each heater electrode 50 are described in detail. As described above, the electrostatic chuck 100 includes the plurality of heater electrodes 50 (more specifically, three heater electrodes, a heater electrode 50A, a heater electrode 50B, and a heater electrode 50C) (see FIG. 3). In the present embodiment, the plurality of heater electrodes 50 are disposed on an upper surface S8 of the substrate layer 111 constituting the lower portion 102 of the plate-shaped member 10 (a surface on a side opposite to a surface facing the joining portion 30). That is, the plurality of heater electrodes 50 are disposed so as to be sandwiched between the cover layer 112 and the substrate layer 111 constituting the lower portion 102 of the plate-shaped member 10.

As shown in FIG. 3, in the electrostatic chuck 100 of the present embodiment, the main body section 108 of the plate-shaped member 10 is divided virtually into three segments Z (Za, Zb, Zc) disposed side by side in the planar direction. More specifically, the main body section 108 of the plate-shaped member 10 is divided virtually into the three segments Z by two circular virtual division lines VL (VL1, VL2) that are concentric to an outer peripheral line of the main body section 108. The shape of each segment Z when viewed in the Z-axis direction is a substantially circular shape or a substantially circular ring shape.

The plurality of heater electrodes 50 are each disposed in a corresponding one of the plurality of segments Z that are set in the main body section 108 of the plate-shaped member 10. Specifically, among the three heater electrodes 50, the heater electrode 50A is disposed in the segment Za on an outermost peripheral side among the three segments Z, the heater electrode 50C is disposed in the segment Zc on a side closest to the center among the three segments Z, and the remaining heater electrode 50B is disposed in the segment Zb interposed between the segment Za and the segment Zc.

Each heater electrode 50 includes a heater line section 51 that is a linear resistance heater when viewed in the Z-axis direction, and heater pad sections 52 connected to two end portions of the heater line section 51. The heater line section 51 and each heater pad section 52 constituting each heater electrode 50 is made of a conductive material (for example, tungsten, molybdenum, platinum, or copper). In the present embodiment, the shape of each heater line section 51 when viewed in the Z-axis direction is a substantially circular shape or a substantially spiral shape.

The electrostatic chuck 100 also includes the structure for supplying electric power to each heater electrode 50. Specifically, the electrostatic chuck 100 includes a plurality of driver electrodes 60 (more specifically, six driver electrodes 60) (see FIG. 4). Each driver electrode 60 is a conductive pattern having a predetermined shape that is parallel to the planar direction, and is made of a conductive material (for example, tungsten, molybdenum, or platinum). In the present embodiment, the plurality of driver electrodes 60 are disposed in the substrate layer 111 constituting the lower portion 102 of the plate-shaped member 10. The plurality of driver electrodes 60 are disposed at locations that correspond to each other in the Z-axis direction. Note that the driver electrodes 60 differ from the heater electrodes 50 in that they satisfy at least one of (1) and (2) below.

(1) The sectional area of each driver electrode 60 in a direction perpendicular to a direction of flow of electric current is greater than or equal to 5 times the same sectional area of each heater electrode 50.

(2) The resistance of each heater electrode 50 from one via that is connected to the driver electrode 60 to the other via is greater than or equal to 5 times the resistance of each driver electrode 60 from a via that is connected to the heater electrode 50 to a via that is connected to a power-supply terminal 74.

As shown in FIG. 4, in the present embodiment, the six driver electrodes 60 of the electrostatic chuck 100 constitute three driver electrode pairs 600 (600A, 600B, 600C) each being constituted by a pair of driver electrodes 60. The three driver electrode pairs 600 correspond to three heater electrodes 50 (50A, 50B, 50C). As shown in FIGS. 2 to 4, one driver electrode 60 of the pair of driver electrodes 60 constituting one driver electrode pair 600 (for example, the driver electrode pair 600A) is electrically connected to one heater pad section 52 of the corresponding heater electrode 50 (for example, the heater electrode 50A) through a heater-side via 71 formed by using a conductive material. The other driver electrode 60 of the pair of driver electrodes 60 constituting the driver electrode pair 600 (for example, the driver electrode pair 600A) is electrically connected to the other heater pad section 52 of the corresponding heater electrode 50 (for example, the heater electrode 50A) through a heater-side via 71.

As shown in FIG. 2, a plurality of terminal holes 110 extending from the lower surface S7 of the base member 20 to the inner portion of the plate-shaped member 10 are formed in the electrostatic chuck 100. Each terminal hole 110 is an integrated hole formed by causing a through hole 22 extending through the base member 20 in the up-down direction, a through hole 32 extending through the joining portion 30 in the up-down direction, and a concave portion 13 formed on a side of the lower surface S2 of the plate-shaped member 10 to communicate with each other.

Each terminal hole 110 accommodates the corresponding power-supply terminal 74 that is a substantially columnar member made of a conductive material. Each power-supply electrode (electrode pad) 73 made of a conductive material is disposed at a bottom surface defining the corresponding concave portion 13 of the plate-shaped member 10 forming the corresponding terminal hole 110. An upper-end portion of each power-supply terminal 74 is joined to the corresponding power-supply electrode 73 by, for example, brazing.

As shown in FIGS. 2 and 4, one driver electrode 60 of the pair of driver electrodes 60 of each drive electrode pair 600 is electrically connected to one power-supply electrode 73 via a power-supply-side via 72 extending from the driver electrode 60 to a side of the lower surface S2 of the plate-shaped member 10, and the other driver electrode 60 of the pair of drive electrodes 60 is electrically connected to the other power-supply electrode 73 through the other power-supply-side via 72.

Each power-supply terminal 74 is connected to a power source (not shown). A voltage from the power source is applied to each heater electrode 50 through the power-supply terminal 74, the power-supply electrode 73, the power-supply-side via 72, the driver electrode 60, and the heater-side via 71. When a voltage is applied to each heater electrode 50, each heater electrode 50 generates heat and heats the plate-shaped member 10. Therefore, the temperature distribution of the attraction surface S1 of the plate-shaped member 10 is controlled (that is, the temperature distribution of the wafer W held on the attraction surface S1 is controlled).

Note that, in the electrostatic chuck 100 of the present embodiment, when electric power is supplied to each heater electrode 50 and cooling is performed with the cooling mechanism of the base member 20 (a refrigerant is supplied to the refrigerant flow path 21), and when the difference between the temperature of each heater electrode 50 and the cooling temperature (the temperature of the refrigerant) is greater than or equal to 50° C., the difference between a maximum value and a minimum value of the temperature at the attraction surface S1 of the plate-shaped member 10 is less than or equal to 3.5° C. That is, the temperature difference between each position on the attraction surface S1 of the plate-shaped member 10 is very small. Such a structure can be realized by manufacturing the electrostatic chuck 100 in accordance with a method of manufacturing the electrostatic chuck 100 of the present embodiment that is described below. Note that the temperature of each heater electrode and the temperature at each position on the attraction surface S1 can be measured by using, for example, a temperature measuring device, such as an IR camera. Note that it is more desirable that the temperature difference be less than or equal to 2.5° C. and even more desirable that the temperature difference be less than or equal to 1.5° C.

Figure 5:
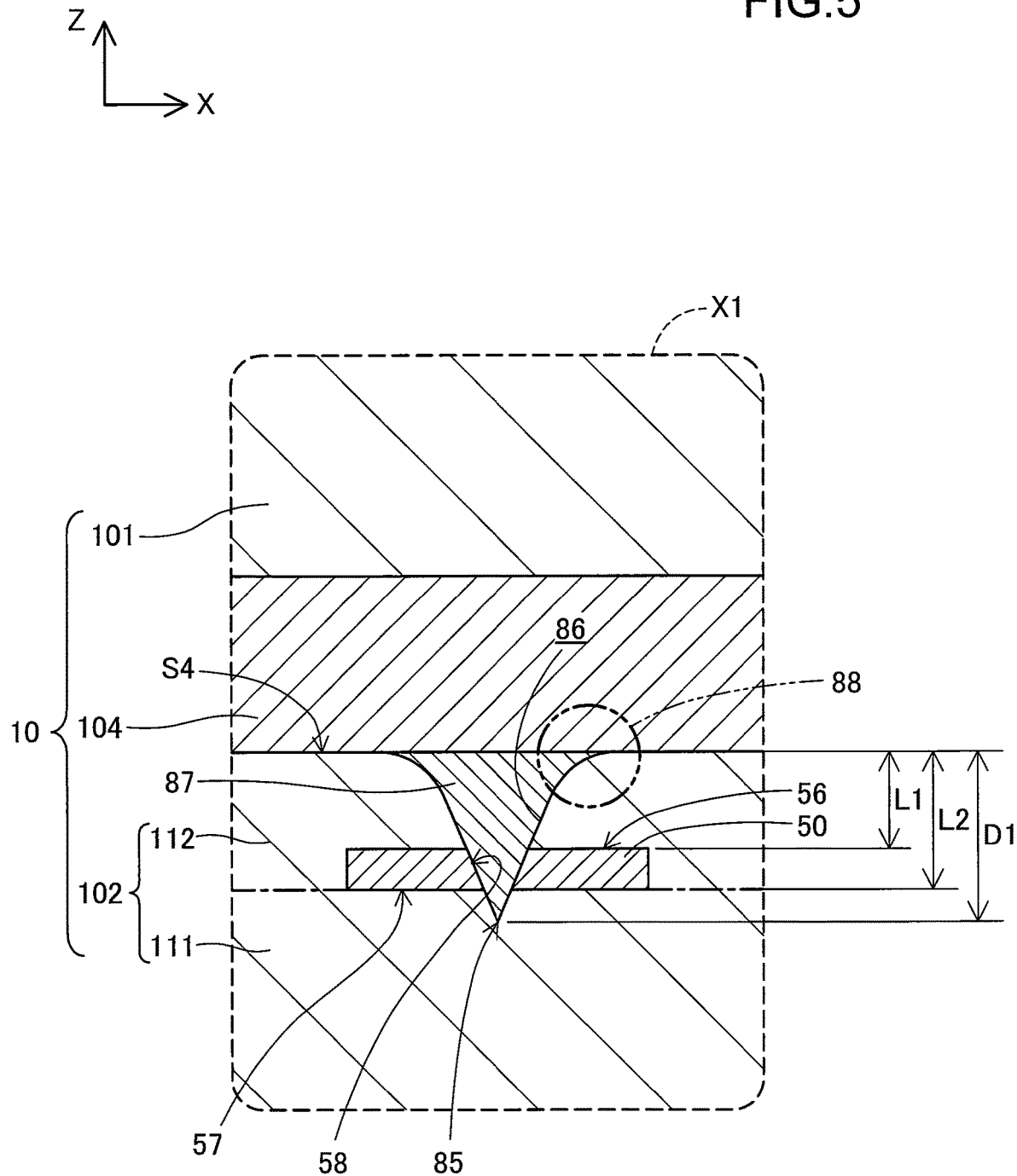
FIG. 5 is an explanatory view showing in detail a structure of a section of a vicinity of a heater electrode 50 in the present embodiment.

FIG. 5 is an explanatory view showing in detail a structure of a section of a vicinity of a heater electrode 50 in the present embodiment. FIG. 5 shows a structure of an XZ section of an X1 portion in FIG. 2. As shown in FIG. 5, in the electrostatic chuck 100 of the present embodiment, a groove 86 is formed in the upper surface S4 of the lower portion 102 constituting the plate-shaped member 10 (that is, the surface facing the intermediate joining portion 104). The number of grooves 86 formed in the upper surface S4 of the lower portion 102 may be one or more than one. The groove 86 has a shape in which a portion near the center of the heater electrode 50 in a width direction extends in an extension direction of the heater electrode 50 when viewed in the Z-axis direction (see section G in FIG. 9 mentioned below).

A portion of a surface defining the groove 86 formed in the upper surface S4 of the lower portion 102 is constituted by a portion of a surface of the heater electrode 50. More specifically, in the present embodiment, such a portion of the surface defining the groove 86 is constituted by a side surface 58 near the center of the heater electrode 50 in the width direction. The groove 86 has a depth that reaches the heater electrode 50. In other words, in at least one section that is parallel to the Z-axis direction (for example, a section orthogonal to the extension direction of the heater electrode 50 like the section shown in FIG. 5), a depth D1 of a deepest portion 85 of the groove 86 is deeper than a minimum value L1 of a distance in the Z-axis direction from a portion other than the groove 86 in the upper surface S4 of the lower portion 102 to each position on the surface of the heater electrode 50 (that is, a distance from the upper surface S4 of the lower portion 102 to an upper surface 56 of the heater electrode 50). Note that, in the present embodiment, the depth of the groove 86 is a depth that allows the groove 86 to extend through the heater electrode 50 in a thickness direction. In other words, in at least one section that is parallel to the Z-axis direction (similarly, for example, the section orthogonal to the extension direction of the heater electrode 50), the depth D1 of the deepest portion 85 of the groove 86 is deeper than a maximum value L2 of a distance in the Z-axis direction from the portion other than the groove 86 in the upper surface S4 of the lower portion 102 to each position on a surface of the heater electrode 50 (that is, a distance from the upper surface S4 of the lower portion 102 to a lower surface 57 of the heater electrode 50).

In at least one section that is parallel to the Z-axis direction (for example, a section orthogonal to the extension direction of the heater electrode 50 like the section shown in FIG. 5), the groove 86 has a tapering shape. In other words, in the section, the groove 86 has a shape whose width (width in a direction orthogonal to the Z axis) becomes narrower with decreasing distance from a deep position (that is, a lower position). More specifically, in the present embodiment, in the section, the groove 86 has a substantially V shape. Therefore, in the section, the groove 86 has a shape in which a line constituting the surface defining the groove 86 has only one bending point (corresponding to the deepest portion 85).

In the present embodiment, in the section above, an edge portion 88 defining an opening of the groove 86 has a round shape. That the edge portion 88 defining the opening of the groove 86 has a round shape means that the shape is a gently sloping shape without a bending point. Note that the curvature radius of the round shape of the edge portion 88 defining the opening of the groove 86 need not be constant. It is desirable that the curvature radius be, for example, greater than or equal to 15 μm.

In the present embodiment, an insulating material 87 is disposed in the groove 86. As the insulating material 87, for example, an adhesive, such as a silicone-based resin, an acrylic resin, or an epoxy-based resin, or glass is used.

A-3. Method of Manufacturing Electrostatic Chuck 100

Figure 6:
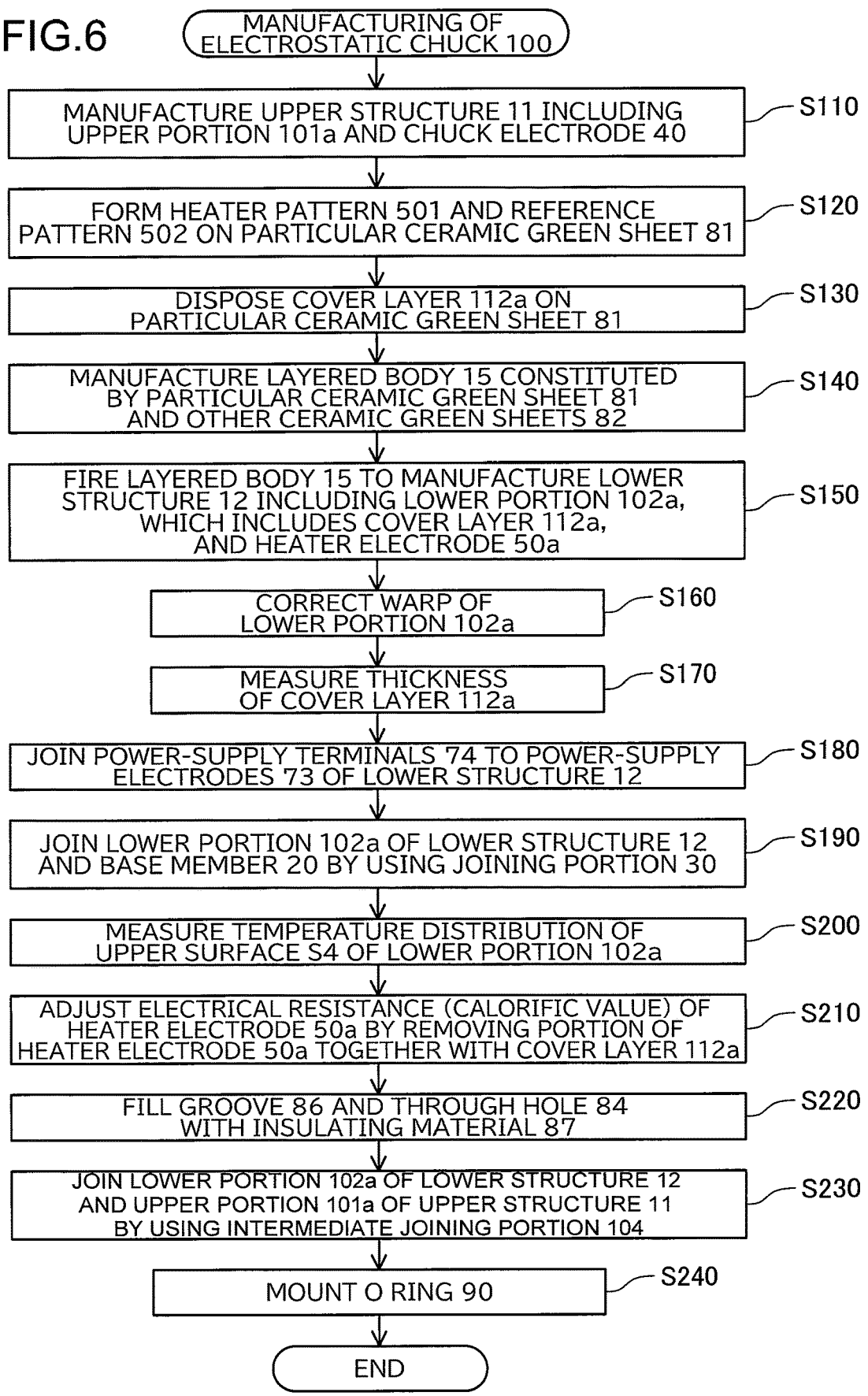
FIG. 6 is a flowchart illustrating a method of manufacturing the electrostatic chuck 100 in the present embodiment.

Next, a method of manufacturing the electrostatic chuck 100 in the present embodiment is described. FIG. 6 is a flowchart illustrating a method of manufacturing the electrostatic chuck 100 in the present embodiment. FIGS. 7 to 10 are each an explanatory view illustrating an outline of the method of manufacturing the electrostatic chuck 100 in the present embodiment. FIGS. 7 to 10 do not illustrate a structure of a portion of the electrostatic chuck 100 during the manufacturing or at the time of completion of the manufacturing.

Figure 7:
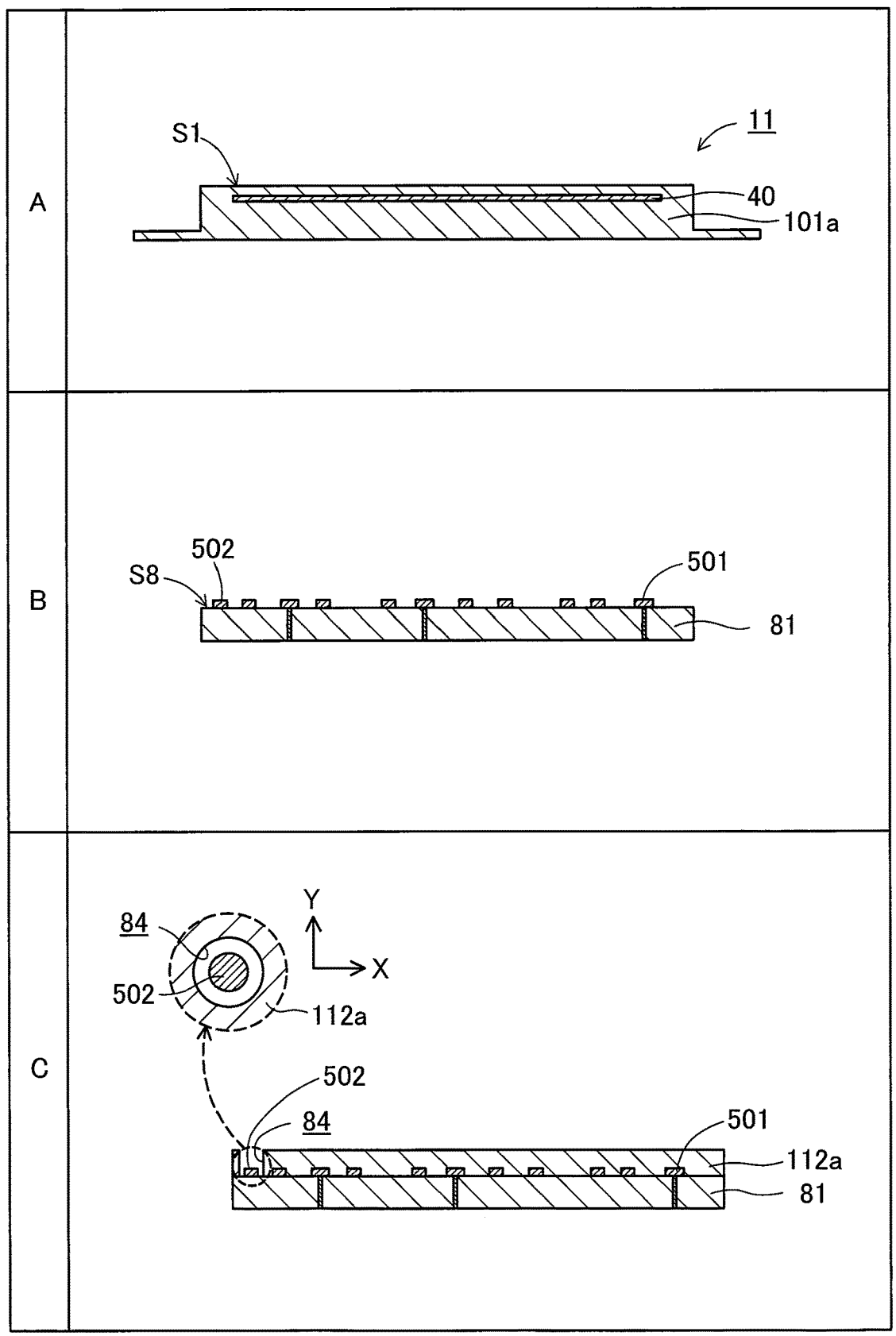
FIG. 7 is an explanatory view illustrating an outline of the method of manufacturing the electrostatic chuck 100 in the present embodiment.

First, an upper structure 11 including an upper portion 101a and a chuck electrode 40 disposed in the upper portion 101a is manufactured (refer to S110 and section A in FIG. 7). Here, the upper portion 101a is a structure that becomes an upper portion 101 in the electrostatic chuck 100 after the completion of the manufacturing. The upper portion 101a may be a portion that is exactly the same as the upper portion 101 or a portion that becomes the upper portion 101 as a result of performing various processing operations on the upper portion 101a.

A method of manufacturing the upper structure 11 is, for example, as follows. First, a plurality of ceramic green sheets are manufactured and a predetermined processing operation is performed on a predetermined ceramic green sheet. Examples of the predetermined processing operation include forming holes or printing using a metalizing paste for forming, for example, the chuck electrode 40. These ceramic green sheets are stacked and are thermally pressure-bonded, and are subjected to processing operations, such as a cutting operation, as a result of which a layered body constituted by the ceramic green sheets is manufactured. By firing the manufactured layered body constituted by the ceramic green sheets, the upper structure 11 is acquired. Note that, if necessary, for example, a warp of the upper portion 101a constituting the upper structure 11 may be corrected or a surface of the upper portion 101a constituting the upper structure 11 may be polished.

On an upper surface S8 of the predetermined ceramic green sheet (hereunder referred to as a "particular ceramic green sheet 81"), a heater pattern 501 is formed by using a heater material, which is a material for forming a heater electrode 50, and one or more standard patterns 502, which serve as a reference when removing a portion of the heater electrode 50 as described below, are formed (refer to S120 and section B in FIG. 7). Specifically, the heater pattern 501 is formed by, for example, screen printing by using a metalizing ink, which is a material for forming the heater electrode 50 (heater material). The shape of the heater pattern 501 is a shape determined in accordance with the design shape of the heater electrode 50. The reference pattern 502 is formed by, for example, screen printing by using a predetermined material (for example, a metalizing ink that is the same as the material for forming the heater electrode 50). It is desirable that the material for forming the reference pattern 502 be the same as the material for forming the heater pattern 501. Although the reference pattern 502 may have any shape, in the present embodiment, the shape of the reference pattern 502 is a substantially circular plate shape when viewed in the Z-axis direction (refer to section C in FIG. 7). The heater pattern 501 and the reference pattern 502 may be formed by performing the same step or may be formed in turn by performing different steps. The heater pattern 501 and the reference pattern 502 may be formed by methods other than screen printing (for example, a photo-lithography method). Note that the particular ceramic green sheet 81 becomes a portion of a substrate layer 111a constituting a lower portion 102a of a plate-shaped member 10 (a portion on a side of the upper surface S8 at which a heater electrode 50a is disposed) by a firing step (described later). Therefore, the particular ceramic green sheet 81 is subjected to required processing operations (such as forming holes for forming vias, and filling with a metalizing paste). Step S120 is an example of a forming step in the claims, and the particular ceramic green sheet 81 is an example of a first ceramic green sheet in the claims.

Next, a cover layer 112a for covering the heater pattern 501 is disposed on the particular ceramic green sheet 81 (refer to S130 and section C in FIG. 7). The cover layer 112a is a sheet-like member made of an insulating material (in the present embodiment, a ceramic). The cover layer 112a has a disc shape having a diameter that is substantially the same as the diameter of the upper surface S8, at which the heater pattern 501 is formed, of the particular ceramic green sheet 81. The cover layer 112a is pressure-bonded so as to cover the entire upper surface S8 of the particular ceramic green sheet 81. As shown in section C in FIG. 7, a through hole 84 extending through the cover layer 112a in a thickness direction is formed in the cover layer 112a at a position that overlaps the reference pattern 502 formed on the particular ceramic green sheet 81. Therefore, the reference pattern 502 is in an exposed state (visible state) through the through hole 84 formed in the cover layer 112a. As described above, since one or more reference patterns 502 are formed on the particular ceramic green sheet 81, one or more through holes 84 are formed in the cover layer 112a. Step S130 is an example of a disposing step in the claims, and the through hole 84 formed in the cover layer 112a is an example of a first hole and a second hole in the claims.

Figure 8:
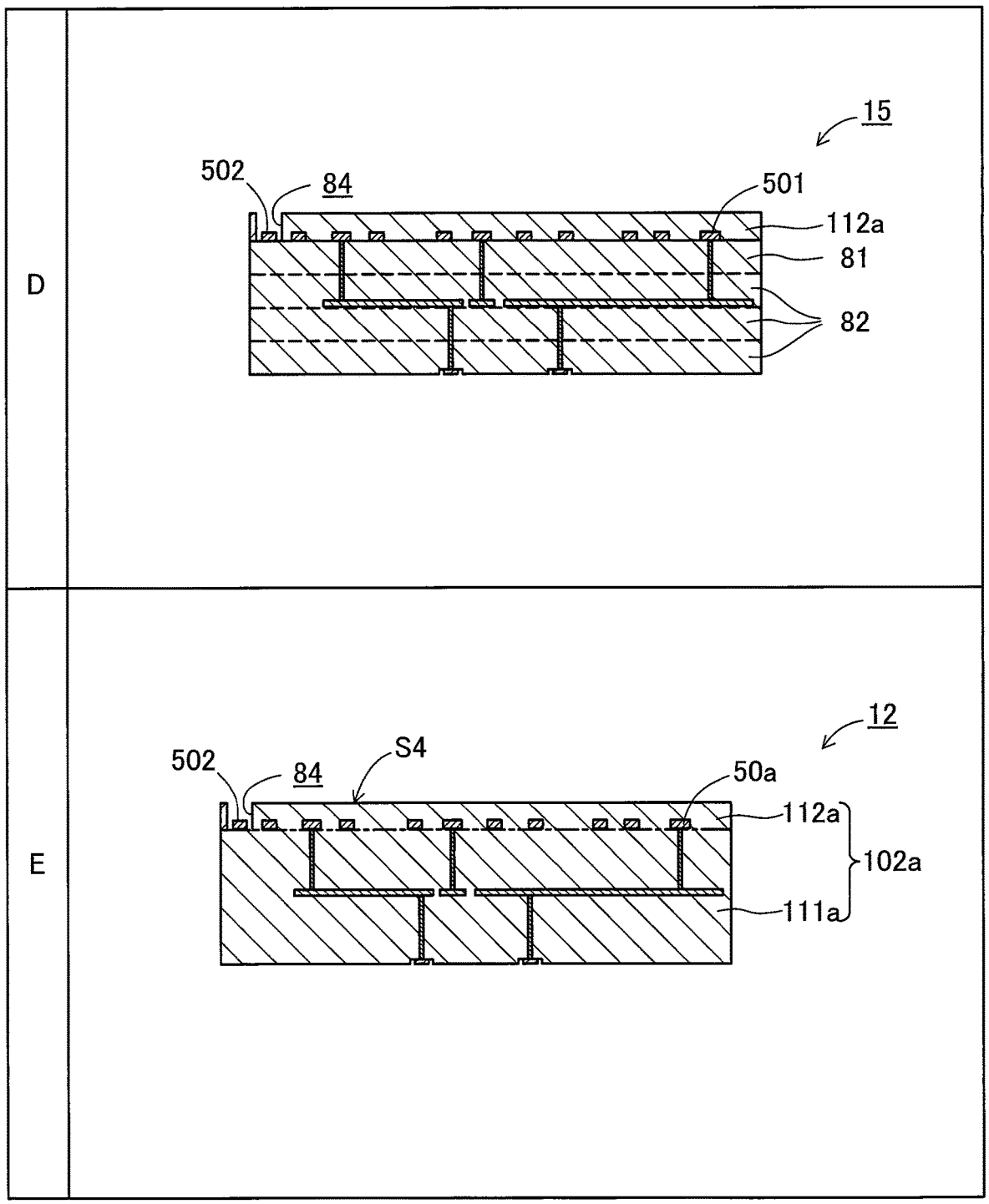
FIG. 8 is an explanatory view illustrating an outline of the method of manufacturing the electrostatic chuck 100 in the present embodiment.

Next, one or a plurality of other ceramic green sheets 82 are stacked on a surface of the particular ceramic green sheet 81 on a side opposite to the upper surface S8 at which the heater pattern 501 is formed, to manufacture a layered body 15 constituted by the ceramic green sheets 81 and 82, including the particular ceramic green sheet 81, that are stacked upon each other (refer to S140 and section D in FIG. 8). The layered body 15 is manufactured by stacking and thermally pressure-bonding the ceramic green sheets 81 and 82 and by subjecting the ceramic green sheets 81 and 82 to processing operations, such as a cutting operation. Note that the other ceramic green sheets 82 become a portion of the substrate layer 111a constituting the lower portion 102a of the plate-shaped member 10 (a portion on a side of a surface facing a joining portion 30) by the firing step (described later). Therefore, the other ceramic green sheets 82 are subjected to required processing operations (such as printing using a metalizing paste for forming, for example, a driver electrode 60 or a power-supply electrode 73, forming holes for forming various vias, and filling with the metalizing paste).

Next, by firing the manufactured layered body 15, a lower structure 12 including the lower portion 102a of the plate-shaped member 10 and the heater electrode 50a is manufactured (refer to S150 and section E in FIG. 8). The lower portion 102a of the plate-shaped member 10 is constituted by the substrate layer 111a that is a ceramic sintered body formed by firing the ceramic green sheets 81 and 82 and a member formed by firing the cover layer 112a (for convenience, this member is also called the cover layer 112a). The heater electrode 50a is formed by firing the heater pattern 501. The lower portion 102a (the cover layer 112a and the substrate layer 111a) and the heater electrode 50a are structural bodies that become a lower portion 102 (a cover layer 112 and a substrate layer 111) and the heater electrode 50 of the electrostatic chuck 100, respectively, after the manufacturing has been completed. The lower portion 102a and the heater electrode 50a may be exactly the same as the lower portion 102 and the heater electrode 50, or may become the lower portion 102 and the heater electrode 50 as a result of performing various processing operations on the lower portion 102a and the heater electrode 50a. Steps S140 and S150 are examples of a firing step in the claims.

Next, a warp of the lower portion 102a constituting the lower structure 12 is corrected (S160). More specifically, first, a first warp correcting step of correcting a warp of the lower portion 102a by heating the lower portion 102a while applying a load to the lower portion 102a is performed. Specifically, for example, in a humidified hydrogen-nitrogen atmosphere, both surfaces of the lower portion 102a are heated at a predetermined temperature (for example, 1400 to 1500° C.) while applying a load (for example, 3 to 20 kPa) to both the surfaces of the lower portion 102a by sandwiching both the surfaces by a pair of pressurizing members (for example, tungsten plates or molybdenum plates). Next, a second warp correcting step of correcting the warp of the lower portion 102a by polishing an upper surface S4 of the cover layer 112a (the fired cover layer 112a) constituting the lower portion 102a is performed. The cover layer 112a has a thickness that does not allow the heater electrode 50a to be exposed even if the cover layer 112a is polished for correcting the warp.

Next, the thickness of the cover layer 112a constituting the lower portion 102a is measured (S170). As described above, since one or more through holes 84 are formed in the cover layer 112a, the thickness of the cover layer 112a is measured at the position of the through hole 84. It is desirable that the thickness of the cover layer 112a be measured at a plurality of locations. Step S170 is an example of a thickness measuring step in the claims.

Figure 9:
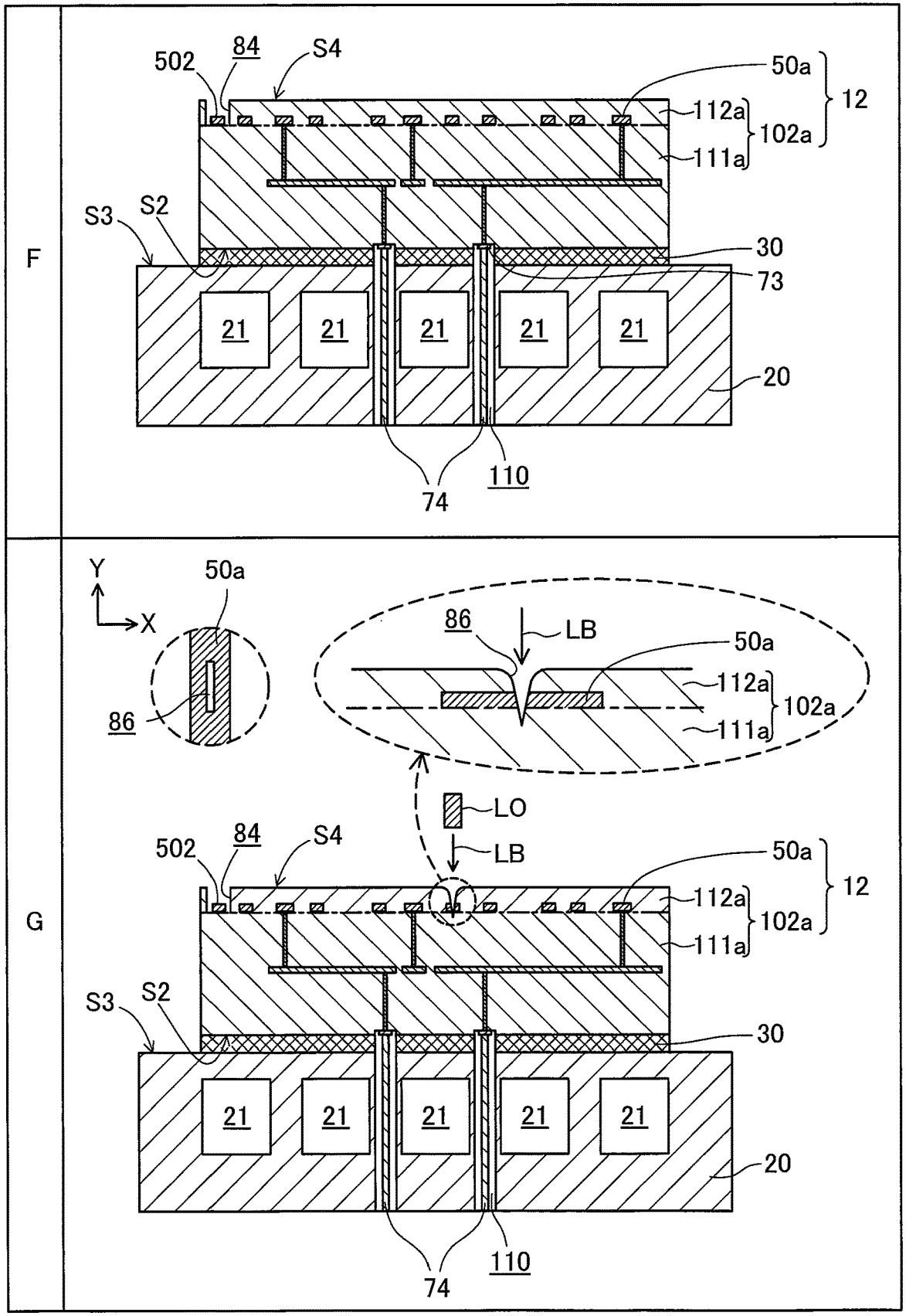
FIG. 9 is an explanatory view illustrating an outline of the method of manufacturing the electrostatic chuck 100 in the present embodiment.

Next, power-supply terminals 74 are joined by, for example, brazing to power-supply electrodes 73 formed at the lower structure 12 (refer to S180 and section F in FIG. 9). Note that before joining the power-supply terminals 74 to the power-supply electrodes 73, surfaces of the power-supply electrodes 73 are plated (for example, with nickel).

Next, the lower portion 102a constituting the lower structure 12 and a base member 20 are joined to each other with the joining portion 30 (refer to S190 and section F in FIG. 9). More specifically, for example, an adhesive containing a silicone-based resin (a paste-like adhesive or a sheet-like adhesive) is disposed on, for example, an upper surface S3 of the base member 20, the lower structure 12 including the lower portion 102a is disposed on the adhesive, and a curing operation for curing the adhesive is performed. Therefore, the joining portion 30 that joins the lower portion 102a constituting the lower structure 12 and the base member 20 to each other is formed. Step S190 is an example of a first joining step in the claims.

Next, while cooling with a cooling mechanism of the base member 20 (supplying a refrigerant to a refrigerant flow path 21) and supplying electric power to each heater electrode 50a disposed in the lower structure 12, the temperature distribution of the upper surface S4 of the lower portion 102a (a surface on a side opposite to a surface facing the joining portion 30) is measured (S200). The temperature distribution is measured by, for example, measuring the temperatures at a plurality of measurement points on the upper surface S4 of the lower portion 102a. Step S200 is an example of a temperature measuring step in the claims.

Next, based on the results of measurement of the temperature distribution in S200, the electrical resistance of the heater electrode 50a is adjusted by removing a portion of the heater electrode 50a covered by the cover layer 112a together with the cover layer 112a. Therefore, the calorific value of the heater electrode 50a is adjusted (refer to S210 and section G in FIG. 9). When a portion of the heater electrode 50a is removed, the electrical resistance is increased due to the sectional area at this portion of the heater electrode 50a being reduced, as a result of which the calorific value at this portion of the heater electrode 50a is increased. Therefore, by removing, for example, a portion of the heater electrode 50a having a relatively low temperature in the results of measurement of the temperature distribution in S200, it is possible to correct the temperature at this portion to a high temperature. Step S210 is an example of an adjusting step in the claims.

Note that when removing the heater electrode 50a (and the cover layer 112a), the removal position on the heater electrode 50a in a planar direction is set with reference to the position of the reference pattern 502, the reference pattern 502 being exposed through the through hole 84 formed in the cover layer 112a. Similarly to the heater pattern 501, which is the heater electrode 50a before firing, the reference pattern 502 is formed on the particular ceramic green sheet 81 before firing. Therefore, even if the ceramic shrinks in the firing step, the relationship between the position of the heater electrode 50a and the reference pattern 502 relative to each other does not change. Consequently, it is possible to precisely remove the heater electrode 50a by setting the removal position on the heater electrode 50a with reference to the position of the reference pattern 502. Note that, as shown section G in FIG. 9, the removal position on the heater electrode 50a in the planar direction is desirably a portion other than an end portion of the heater electrode 50a (a central portion thereof) in a width direction (in section G in FIG. 9, an X-axis direction). That is, it is desirable that the heater electrode 50a be removed so that a groove 86 in an extension direction of the heater electrode 50a (in section G in FIG. 9, a Y-axis direction) is formed. Therefore, even if the removal position on the heater electrode 50a in the width direction is displaced, it is possible to suppress a deviation in the size of the removal width of the heater electrode 50a. Consequently, it is possible to suppress variations in the effect of adjusting the electrical resistance (the calorific value) of the heater electrode 50a resulting from removing the heater electrode 50a, and to precisely adjust the electrical resistance (the calorific value) of the heater electrode 50a. Note that the heater electrode 50a may be removed so that a plurality of grooves 86 are formed side by side in the width direction of the heater electrode 50a.

Note that, for example, when the groove 86 has been formed in a certain location of the heater electrode 50a, and another groove 86 is further formed in another location of the heater electrode 50a adjacent to the certain location, the effect of adjusting the electrical resistance (the calorific value) of the heater electrode 50a (the electrical resistance (calorific value) increasing effect) is increased due to the formation of one groove 86 compared with when the one such other groove 86 is not formed. When setting the removal portion of the heater electrode 50a, it is desirable to consider the effect of increasing such an adjustment effect.

When removing the heater electrode 50a (and the cover layer 112a), the removal depth is set based on the thickness of the cover layer 112a measured in S170. This is because, even if the removal depth mean the same, the depth of the heater electrode 50a that is to be removed may differ in accordance with the thickness of the cover layer 112a. Note that, as illustrated in section G in FIG. 9, it is desirable that the removal depth be set so that the entire heater electrode 50a in the thickness direction is removed (that is, a portion of the substrate layer 111a disposed below the heater electrode 50a is also removed). Compared with when only a portion of the heater electrode 50a in the thickness direction is removed, this makes it possible to suppress variations in the effect of adjusting the electrical resistance (the calorific value) of the heater electrode 50a resulting from removing the heater electrode 50a, and to precisely adjust the electrical resistance (the calorific value) of the heater electrode 50a.

Note that the heater electrode 50a (and the cover layer 112a) is removed by, for example, forming a groove 86 in the upper surface S4 of the lower portion 102a by irradiating the upper surface S4 of the lower portion 102a (a surface on a side at which the cover layer 112a is disposed) with laser light LB by using a laser oscillator LO. A portion of a surface defining the groove 86 formed in this way is formed by a portion of a surface of the heater electrode 50a (a surface that is exposed by the removal above). In the present embodiment, since the sectional shape of the groove 86 is a substantially V shape as illustrated in section G in FIG. 9, as described above, when removing the heater electrode 50*a*, it is more desirable to set the removal depth based on the thickness of the cover layer 112*a*. When, of the laser light LB, an ultra-short pulse laser whose pulse wavelength is in a femtosecond region ($10^{-15}$) to a picosecond region ($10^{-12}$) is used, compared with the rate of increase in temperature caused by heat that is generated by applying the laser light LB, the rate of diffusion of the generated heat toward a base material is higher. Therefore, it is possible to suppress occurrence of problems such as the shape of a peripheral portion of the removal portion being unstable due to the influence of the heat at the time of processing operations being small. Consequently, the use of such an ultra-short pulse laser is desirable. In addition, the heater electrode 50*a* can be removed by other methods (for example, shot-blasting or grinding by using a machining device).

Note that the shape of the groove 86 can be adjusted when forming the groove 86 by, for example, adjusting the irradiation strength and the number of irradiations using the laser light LB, and adjusting the particle size of a shot blast and the shot-blasting speed. In the present embodiment, in at least one section that is parallel to the Z-axis direction (for example, a section orthogonal to the extension direction of the heater electrode 50 like the section shown in FIG. 5), an edge portion 88 defining an opening of the groove 86 has a round shape. The groove 86 having such a shape can be formed by, for example, buffing the edge portion 88 defining the opening of the groove 86 after forming the groove 86 by, for example, applying the laser light LB. Alternatively, for example, when forming the groove 86 by applying the laser light LB, the groove 86 having such a shape can be formed even by reducing the number of irradiations using the laser light LB with decreasing distance from an end portion defining the groove 86 in the width direction.

After adjusting the electrical resistance (the calorific value) of the heater electrode 50*a* by removing the heater electrode 50*a*, it is possible to, for example, re-measure the temperature distribution of the upper surface S4 of the lower portion 102*a* as in Step S200, confirm the results of adjustment of the electrical resistance (the calorific value) of the heater electrode 50*a*, determine whether to remove again the heater electrode 50*a*, and, if necessary, remove again the heater electrode 50*a*. This makes it possible to finely adjust the electrical resistance (the calorific value) of the heater electrode 50*a*, to prevent excessive adjustments, and to reduce the adjustment time. Whether to adjust the electrical resistance (the calorific value) of the heater electrode 50*a* can be confirmed based on, for example, whether there are changes in the resistance of the heater electrode 50*a* or whether there are changes in an image provided by an IR camera.

Figure 10:
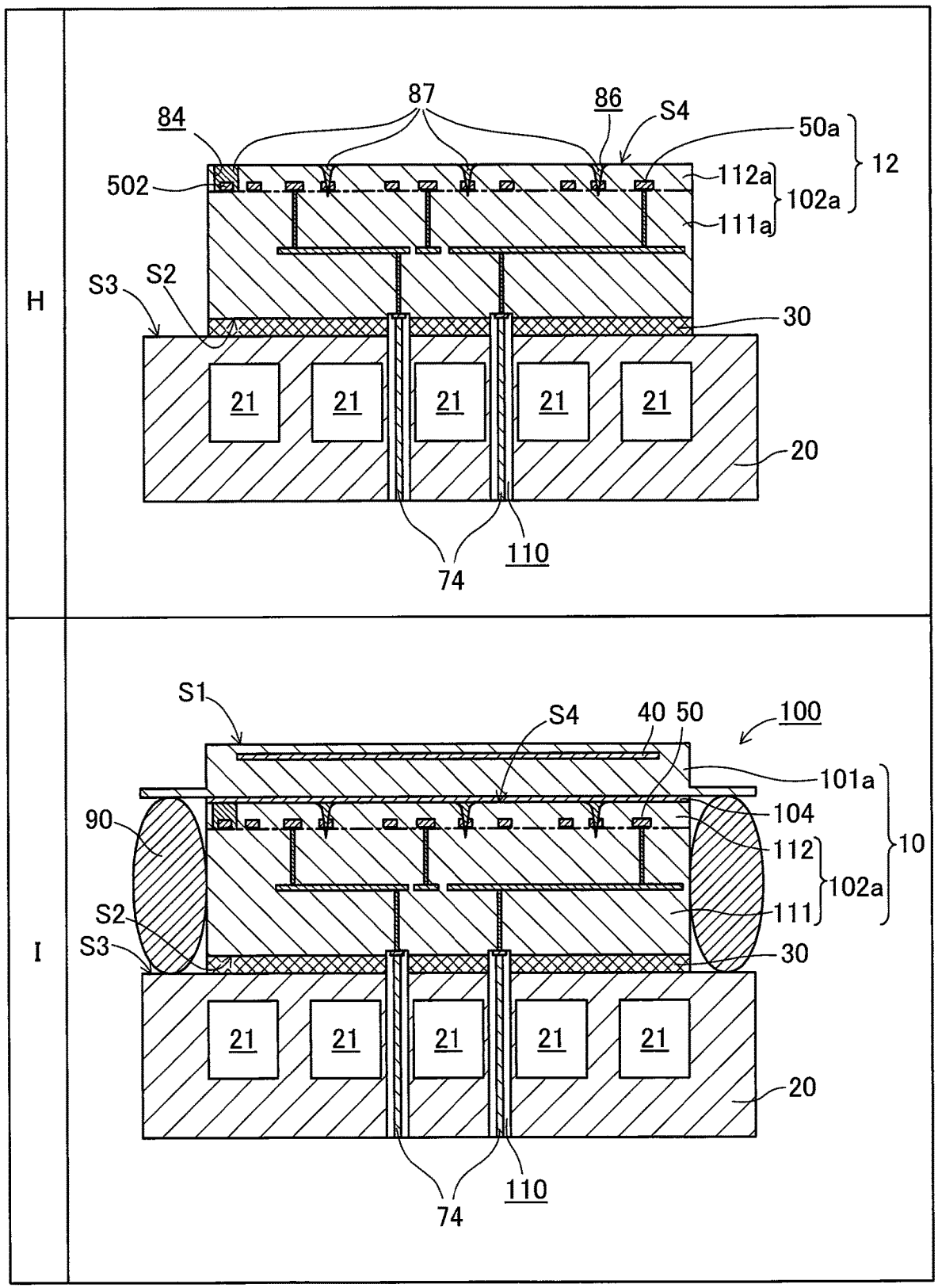
FIG. 10 is an explanatory view illustrating an outline of the method of manufacturing the electrostatic chuck 100 in the present embodiment.

Next, the groove 86 formed in the upper surface S4 of the lower portion 102*a* (the portion at which removal has been performed in the adjusting step) and the through hole 84 formed in the cover layer 112*a* are filled with an insulating material 87 (refer to S220 and section H in FIG. 10). In the present embodiment, as the insulating material 87, a material that is the same as the material of an intermediate joining portion 104 is used. Step S220 is an example of a filling step in the claims.

Next, the upper portion 101*a* constituting the upper structure 11 manufactured in S110 is joined to the upper surface S4 of the lower portion 102*a* constituting the lower structure 12 by using the intermediate joining portion 104 (refer to S230 and section I in FIG. 10). More specifically, for example, an adhesive containing a silicone-based resin (a paste-like adhesive or a sheet-like adhesive) is disposed on, for example, the upper surface S4 of the lower portion 102*a*, the upper portion 101*a* is disposed on the adhesive, and a curing operation for curing the adhesive is performed. Therefore, the intermediate joining portion 104 that joins the lower portion 102*a* and the upper portion 101*a* to each other is formed. The plate-shaped member 10 including the lower portion 102*a*, the intermediate joining portion 104, and the upper portion 101*a* is manufactured by performing Step S230. Note that, in the present embodiment, in Step S230, the intermediate joining portion 104 is formed by a curing operation for curing the adhesive by using heat generated by supplying electric power to the heater electrode 50. After Step S230, processing operations, such as polishing the attraction surface S1 of the plate-shaped member 10, may be performed. Step S230 is an example of a second joining step in the claims.

Next, an O ring 90 is mounted so as to surround an outer periphery of a layered body constituted by the lower portion 102*a* and the intermediate joining portion 104 of the plate-shaped member 10 and the joining portion 30 (refer to S240 and section I in FIG. 10). The electrostatic chuck 100 having the above-described structure is manufactured by performing primarily the steps above.

A-4. Effects of the Present Embodiment

As described above, the electrostatic chuck 100 of the present embodiment includes the plate-shaped member 10, the base member 20, and the joining portion 30. The plate-shaped member 10 is a plate-shaped member having the attraction surface S1 and the lower surface S2 on a side opposite to the attraction surface S1. The plate-shaped member 10 includes the upper portion 101 that includes the attraction surface S1, the lower portion 102 that includes the lower surface S2 and a portion made of a ceramic, and the intermediate joining portion 104 that joins the upper portion 101 and the lower portion 102 to each other. The heater electrodes 50 formed from resistance heaters are disposed in the lower portion 102 of the plate-shaped member 10. The base member 20 is a member that has the upper surface S3 and that is disposed so that the upper surface S3 is positioned on a side of the lower surface S2 of the plate-shaped member 10. The base member 20 includes the cooling mechanism. That is, the refrigerant flow path 21 is formed in the base member 20. The joining portion 30 is disposed between the lower surface S2 of the plate-shaped member 10 and the upper surface S3 of the base member 20, and joins the plate-shaped member 10 and the base member 20 to each other.

The method of manufacturing the electrostatic chuck 100 of the present embodiment includes the step of forming the heater pattern 501 on the particular ceramic green sheet 81 by using the material for forming the heater electrode 50 (the forming step, S120); the step of disposing the cover layer 112 on the particular ceramic green sheet 81, the cover layer 112 being made of an insulating material and covering the heater pattern 501 (the disposing step, S130); the step of firing the layered body 15 constituted by the ceramic green sheets 81 and 82, including the particular ceramic green sheet 81, that are stacked upon each other to manufacture the lower portion 102 of the plate-shaped member 10 and the heater electrodes 50 (the firing step, S140, S150); the step of joining the lower portion 102 of the plate-shaped member 10 and the base member 20 to each other by using the joining portion 30 (the first joining step, S190); the step of measuring the temperature distribution of the surface (the upper surface S4) on a side opposite to the surface of the lower portion 102 of the plate-shaped member 10 facing the joining portion 30, while cooling with the cooling mechanism of the base member 20 (supplying a refrigerant to the refrigerant flow path 21) and supplying electric power to the heater electrodes 50 (temperature measuring step, S200); the step of, based on the result of measurement of the temperature distribution, adjusting the electrical resistance (the calorific value) of the heater electrodes 50 by removing a portion of the heater electrodes 50 covered by the cover layer 112 together with the cover layer 112 (adjusting step, S210); and the step of joining the lower portion 102 and the upper portion 101 of the plate-shaped member 10 to each other by using the intermediate joining portion 104 (the second joining step, S230).

In this way, in the method of manufacturing the electrostatic chuck 100 of the present embodiment, with the base member 20 joined to the lower portion 102 that is a portion of the plate-shaped member 10 on the side of the lower surface S2 and that is a portion at which the heater electrodes 50 are disposed, the temperature distribution of the upper surface S4 of the lower portion 102 is measured while cooling is performed with the cooling mechanism of the base member 20 (supplying a refrigerant to the refrigerant flow path 21) and electric power is supplied to the heater electrodes 50. Based on the result of measurement of the temperature distribution, a portion of the heater electrodes 50 covered by the cover layer 112 is removed together with the cover layer 112 to adjust the electrical resistance (the calorific value) of the heater electrodes 50 and to subsequently join the upper portion 101 to the lower portion 102 of the plate-shaped member 10. That is, in the method of manufacturing the electrostatic chuck 100 of the present embodiment, after a portion on the side of the base member 20 (lower side) with respect to the heater electrodes 50 has been formed, in a state that is the same as that at the time of actual use (that is, in a state in which a refrigerant has been supplied to the refrigerant flow path 21 and electric power has been supplied to the heater electrodes 50), it is possible to measure the temperature distribution of the upper surface S4 of the lower portion 102 and to adjust the electrical resistance (the calorific value) of the heater electrodes 50 based on the result of measurement of the temperature distribution. Therefore, according to the method of manufacturing the electrostatic chuck 100 of the present embodiment, it is possible to precisely adjust the electrical resistance (the calorific value) of the heater electrodes 50 in a short time, as a result of which it is possible to increase the controllability of the temperature distribution of the attraction surface S1 of the plate-shaped member 10. Note that, in the present description, "controllability of the temperature distribution of the attraction surface S1 of the plate-shaped member 10 is high" means at least one of "the temperature distribution of the entire attraction surface S1 is nearly uniform" and "the temperature distribution of the attraction surface S1 is nearly uniform for each segment Z.

Further, in the method of manufacturing the electrostatic chuck 100 of the present embodiment, since firing is performed with the heater pattern 501, which is the material for forming the heater electrodes 50, being covered by the cover layer 112, it is possible to suppress deterioration (for example, volatilization and sublimation) of the heater pattern 501 at the time of firing and to suppress a reduction in the controllability of the temperature distribution of the attraction surface S1 of the plate-shaped member 10 caused by variations in the resistance of the heater electrodes 50 due to the deterioration of the heater pattern 501.

The method of manufacturing the electrostatic chuck 100 of the present embodiment further includes the step of filling with the insulating material 87 a portion at which removal has been performed in the adjusting step (S210) (filling step, S220). Therefore, according to the method of manufacturing the electrostatic chuck 100 of the present embodiment, it is possible to suppress entry of a gas into the plate-shaped member 10 while preventing a short circuit between the heater electrodes 50.

In the method of manufacturing the electrostatic chuck 100 of the present embodiment, a through hole 84 is formed in the cover layer 112 that is disposed in the disposing step (S130), the through hole 84 extending through the cover layer 112 in the thickness direction. The manufacturing method further includes the step of measuring the thickness of the cover layer 112 at the position of the through hole 84 after the firing step (S150) (the thickness measuring step, S170). Therefore, according to the method of manufacturing the electrostatic chuck 100 of the present embodiment, based on the thickness of the cover layer 112, it is possible to properly set the removal depth of the cover layer 112 and the removal depth of the heater electrodes 50 in the adjusting step and to precisely adjust the electrical resistance (the calorific value) of the heater electrodes 50, as a result of which it is possible to effectively increase the controllability of the temperature distribution of the attraction surface S1 of the plate-shaped member 10.

The method of manufacturing the electrostatic chuck 100 of the present embodiment further includes the step of correcting a warp of the lower portion 102 (the warp correcting step, S160). The warp correcting step includes, after the firing step (S150), the step of correcting a warp of the lower portion 102 of the plate-shaped member 10 by heating the lower portion 102 while applying a load to the lower portion 102 (the first warp correcting step) and, after the first warp correcting step, the step of correcting the warp of the lower portion 102 by polishing the cover layer 112 (the second warp correcting step). Therefore, according to the method of manufacturing the electrostatic chuck 100 of the present embodiment, the warp of the lower portion 102 that could not be completely corrected even in the first warp correcting step can be corrected in the second warp correcting step of polishing the cover layer 112, and the warp of the lower portion 102 and thus the warp of the plate-shaped member 10 can be effectively reduced. In the method of manufacturing the electrostatic chuck 100 of the present embodiment, when correcting the warp of the lower portion 102, since the heater electrodes 50 are covered by the cover layer 112, it is possible to suppress a reduction in the controllability of the temperature distribution of the attraction surface S1 of the plate-shaped member 10 caused by variations in the resistance of the heater electrodes 50 caused by deterioration of the heater electrodes 50 due to the heater electrodes 50 reacting with a warp correction jig.

In the method of manufacturing the electrostatic chuck 100 of the present embodiment, the forming step of forming the heater pattern 501 on the particular ceramic green sheet 81 (S120) includes forming the reference pattern 502 on the particular ceramic green sheet 81 by using a predetermined material; the through hole 84 is formed in the cover layer 112 at a position that overlaps the reference pattern 502, the cover layer 112 being disposed in the disposing step (S130), the through hole 84 extending through the cover layer 112 in the thickness direction; and, in the adjusting step of adjusting the electrical resistance (the calorific value) of the heater electrodes 50 (S210), the removal position on the heater electrodes 50 is set with reference to the position of the reference pattern 502, the reference pattern 502 being exposed through the through hole 84 formed in the cover layer 112. Therefore, according to the method of manufacturing the electrostatic chuck 100 of the present embodiment, by setting the removal position with reference to the position of the reference pattern 502, it is possible to precisely remove the heater electrodes 50 and to precisely adjust the electrical resistance (the calorific value) of the heater electrodes 50, as a result of which it is possible to effectively increase the controllability of the temperature distribution of the attraction surface S1 of the plate-shaped member 10.

The method of manufacturing the electrostatic chuck 100 of the present embodiment further includes, after the firing step of firing the layered body 15 (S150), the step of measuring the thickness of the cover layer 112 at the position of the through hole 84 for exposing the reference pattern 502 (the thickness measuring step, S170). Therefore, according to the method of manufacturing the electrostatic chuck 100 of the present embodiment, since it is possible to measure the thickness of the cover layer 112 by utilizing the through hole 84 formed in the cover layer 112 for exposing the reference pattern 502, it is possible to reduce the number of holes that are formed in the cover layer 112 and to suppress a reduction in the controllability of the temperature distribution of the attraction surface S1 of the plate-shaped member 10 caused by the existence of the holes.

In the method of manufacturing the electrostatic chuck 100 of the present embodiment, the thermal resistance of the intermediate joining portion 104 is lower than the thermal resistance of the joining portion 30. Therefore, according to the method of manufacturing the electrostatic chuck 100 of the present embodiment, it is possible to suppress a reduction in the responsivity to heating and/or cooling in the plate-shaped member 10 caused by the existence of the intermediate joining portion 104 and to suppress a reduction in the controllability of the temperature distribution of the attraction surface S1 of the plate-shaped member 10.

In the method of manufacturing the electrostatic chuck 100 of the present embodiment, the second joining step (S230) of joining the lower portion 102 and the upper portion 101 of the plate-shaped member 10 to each other by using the intermediate joining portion 104 is a step of forming the intermediate joining portion 104 by using heat generated by supplying electric power to the heater electrodes 50. Therefore, according to the method of manufacturing the electrostatic chuck 100 of the present embodiment, compared with the method of heating the entire device when forming the intermediate joining portion 104, it is possible to suppress adverse effects on other members resulting from the heating (for example, variations in heat conductivity caused by partial peeling of the joining portion 30) and to suppress a reduction in the controllability of the temperature distribution of the attraction surface S1 of the plate-shaped member 10.

In the method of manufacturing the electrostatic chuck 100 of the present embodiment, the adjusting step (S210) of adjusting the electrical resistance (the calorific value) of the heater electrodes 50 is a step of removing the heater electrodes 50 by irradiating the surface of the lower portion 102 of the plate-shaped member 10 on a side at which the cover layer 112 is disposed with the laser light LB. Therefore, according to the method of manufacturing the electrostatic chuck 100 of the present embodiment, it is possible to precisely remove the heater electrodes 50 in the adjusting step and to precisely adjust the electrical resistance (the calorific value) of the heater electrodes 50, as a result of which it is possible to effectively increase the controllability of the temperature distribution of the attraction surface S1 of the plate-shaped member 10.

The electrostatic chuck 100 of the present embodiment includes the plate-shaped member 10, the base member 20, and the joining portion 30. The plate-shaped member 10 is a plate-shaped member having the attraction surface S1 substantially orthogonal to the Z-axis direction and the lower surface S2 on a side opposite to the attraction surface S1. The plate-shaped member 10 includes the upper portion 101 that includes the attraction surface S1, the lower portion 102 that includes the lower surface S2 and a portion made of a ceramic, and the intermediate joining portion 104 that joins the upper portion 101 and the lower portion 102 to each other. The heater electrodes 50 formed from resistance heaters are disposed in the lower portion 102 of the plate-shaped member 10. The base member 20 is a member that has the upper surface S3 and that is disposed so that the upper surface S3 is positioned on a side of the lower surface S2 of the plate-shaped member 10. The base member 20 includes the cooling mechanism. That is, the refrigerant flow path 21 is formed in the base member 20. The joining portion 30 is disposed between the lower surface S2 of the plate-shaped member 10 and the upper surface S3 of the base member 20, and joins the plate-shaped member 10 and the base member 20 to each other. In the electrostatic chuck 100 of the present embodiment, among surfaces of the lower portion 102 of the plate-shaped member 10, the groove 86 is formed in an upper surface S4 that is a surface that faces the intermediate joining portion 104. A portion of a surface defining the groove 86 is constituted by a portion of a surface of the heater electrode 50. In the electrostatic chuck 100 of the present embodiment, when electric power is supplied to each heater electrode 50 and cooling is performed with the cooling mechanism of the base member 20 (a refrigerant is supplied to the refrigerant flow path 21), and when the difference between the temperature of each heater electrode 50 and the cooling temperature (the temperature of the refrigerant) is greater than or equal to 50° C., the difference between a maximum value and a minimum value of the temperature at the attraction surface S1 of the plate-shaped member 10 is less than or equal to 3.5° C.

In this way, in the electrostatic chuck 100 of the present embodiment, the groove 86 is formed in the upper surface S4 of the lower portion 102 of the plate-shaped member 10, a portion of the surface defining the groove 86 is constituted by a portion of the surface of the heater electrode 50, electric power is supplied to the heater electrodes 50, and the temperature difference between each position on the attraction surface S1 of the plate-shaped member 10 in a state in which cooling has been performed with the cooling mechanism of the base member 20 is very small. Therefore, according to the electrostatic chuck 100 of the present embodiment, it is possible to effectively increase the controllability of the temperature distribution of the attraction surface S1 of the plate-shaped member 10.

In the electrostatic chuck 100 of the present embodiment, in at least one section that is parallel to the Z-axis direction (for example, a section orthogonal to the extension direction of the heater electrode 50 like the section shown in FIG. 5), the edge portion 88 defining the opening of the groove 86 has a round shape. Therefore, according to the electrostatic chuck 100 of the present embodiment, compared with a structure in which the edge portion 88 has a pointed shape instead of a round shape, when a force is applied to a portion near the edge portion 88 when, for example, manufacturing the electrostatic chuck 100, it is possible to cause the force to escape smoothly and to increase the area of the section that is subjected to a shock, as a result of which it is possible to suppress the vicinity of the edge portion 88 defining the opening of the groove 86 from breaking.

Figure 11:
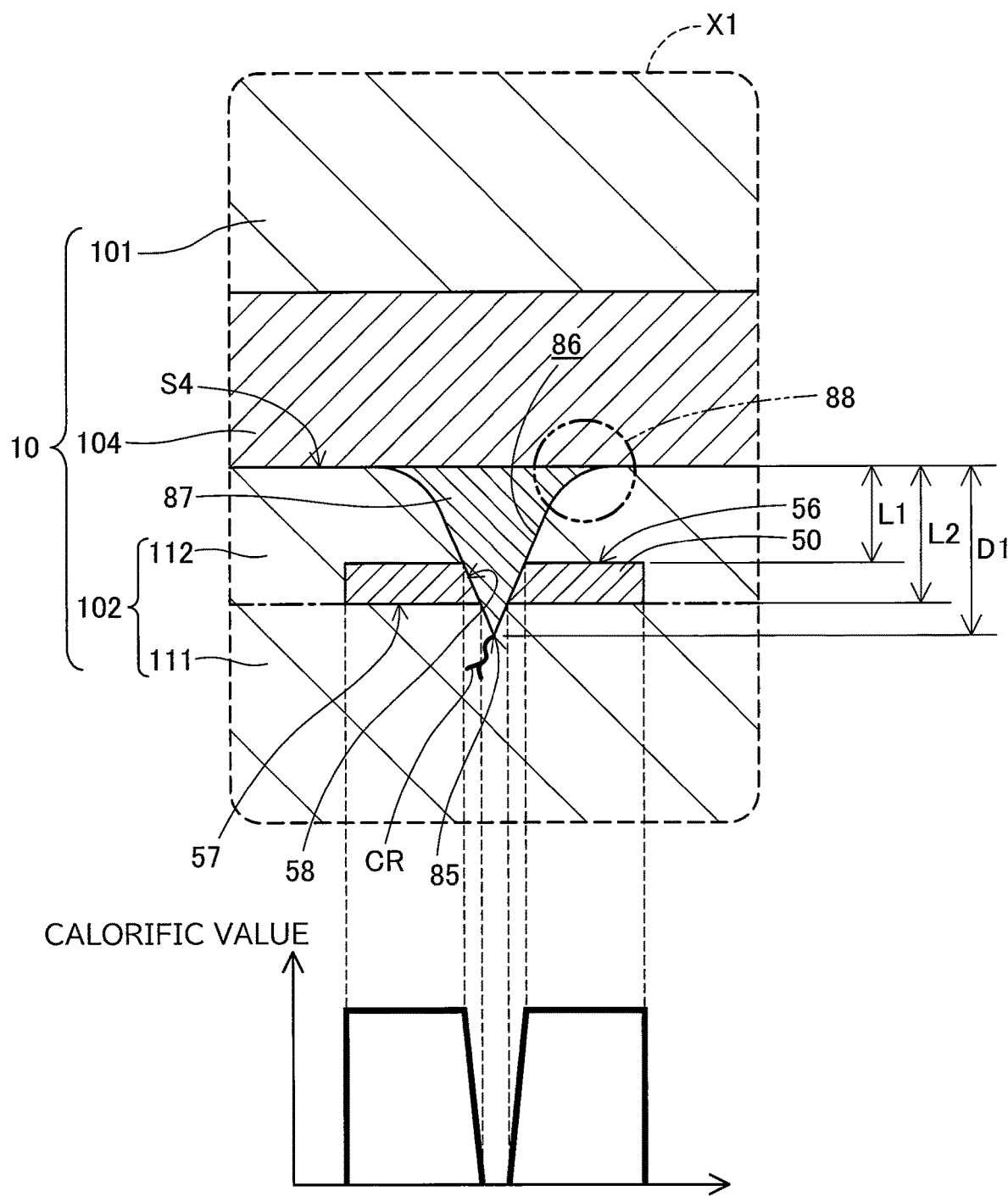
FIG. 11 is an explanatory view showing in detail a structure of a section of a vicinity of the heater electrode 50 in the present embodiment.

In the electrostatic chuck 100 of the present embodiment, in at least one section that is parallel to the Z-axis direction (for example, a section orthogonal to the extension direction of the heater electrode 50 like the section shown in FIG. 5), the shape of the groove 86 is a shape in which the depth D1 of the deepest portion 85 of the groove 86 is deeper than the maximum value L2 of the distance in the Z-axis direction from the portion other than the groove 86 in the upper surface S4 of the lower portion 102 to each position on the surface of the heater electrode 50 (that is, the distance to the lower surface 57 of the heater electrode 50). That is, the groove 86 has a shape extending through the heater electrode 50. When the groove 86 has a shape extending through the heater electrode 50, as illustrated in FIG. 11, even if a crack CR occurs with the deepest portion 85 of the groove 86 as a starting point, it is possible to prevent changes in the electrical resistance of the heater electrode 50 caused by the crack CR reaching the inner portion of the heater electrode 50. Therefore, according to the electrostatic chuck 100 of the present embodiment, it is possible to prevent changes in the electrical resistance of the heater electrode 50 caused by the crack CR that has occurred in the lower portion 102 reaching the inner portion of the heater electrode 50, as a result of which it is possible to prevent changes in the calorific value of the heater electrode 50 and to further effectively increase the controllability of the temperature distribution of the attraction surface S1 of the plate-shaped member 10.

Figure 12:
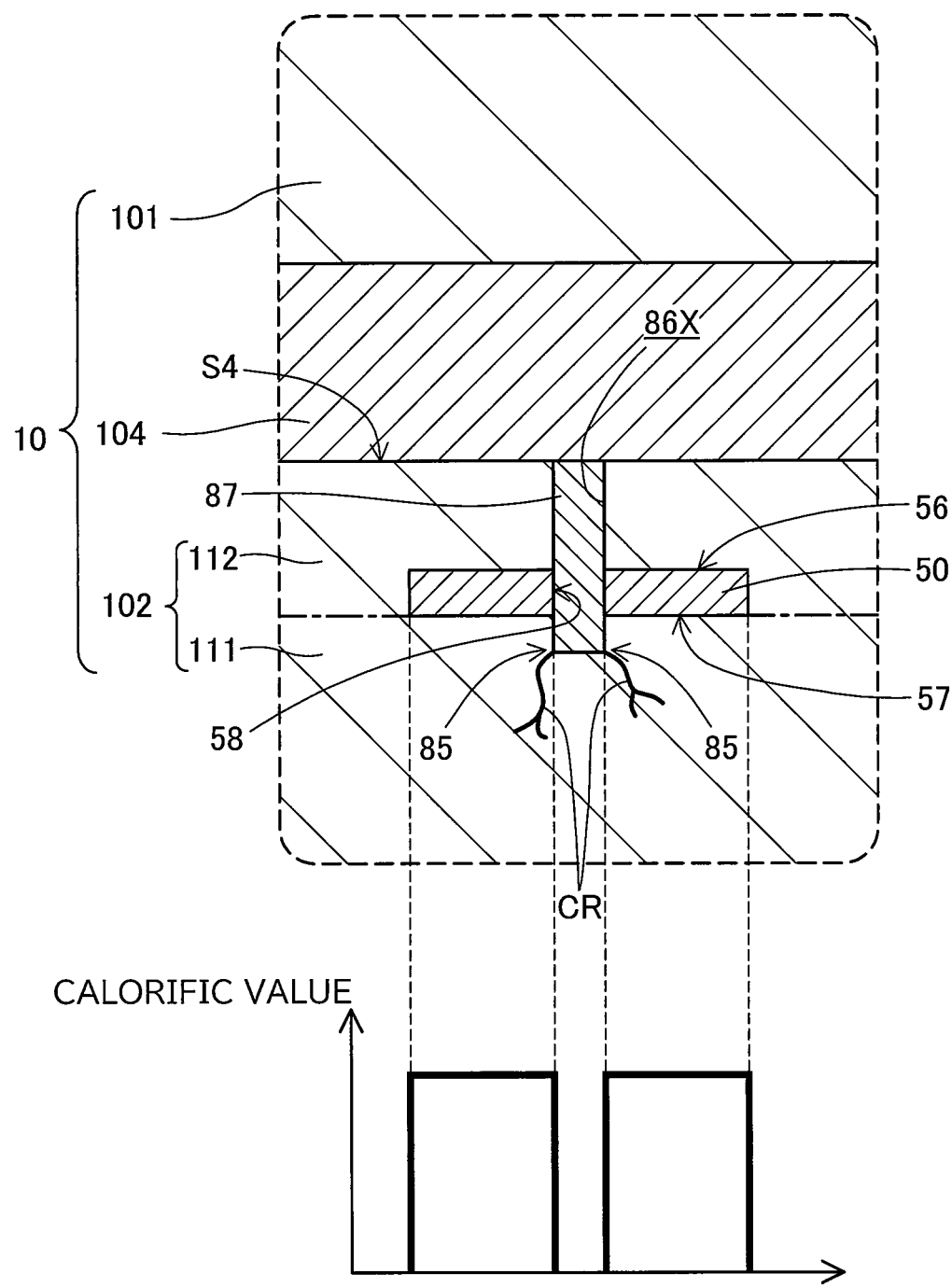
FIG. 12 is an explanatory view showing in detail a structure of a section of a vicinity of a heater electrode 50 in a comparative example.

In the electrostatic chuck 100 of the present embodiment, in at least one section that is parallel to the Z-axis direction (for example, a section orthogonal to the extension direction of the heater electrode 50 like the section shown in FIG. 5), the groove 86 has a shape whose width (width in a direction orthogonal to the Z axis) becomes narrower with decreasing distance from a deep position (that is, a lower position). Here, as in a comparative example shown in FIG. 12, when a removal volume of the heater electrode 50 resulting from a groove 86X is the same as that of the present embodiment and the groove 86X has a shape having a constant width (the section is rectangular in shape), a portion at which the heater electrode 50 does not exist becomes large in the vicinity of a surface of the heater electrode 50 constituting a surface defining the groove 86X, and the electrical resistance (the calorific value) at the positions on the surface of the heater electrode 50 constituting the surface defining the groove 86X changes suddenly. Therefore, deviations in the electrical resistance (the calorific value) of the heater electrode 50 are increased. In contrast, as shown in FIG. 11, in the present embodiment, since the groove 86 has a shape whose width becomes narrower with decreasing distance from the deep position, in the vicinity of the surface of the heater electrode 50 that constitutes the surface defining the groove 86, a portion at which the heater electrode 50 does not exist becomes small, and, at the positions on the surface of the heater electrode 50 that constitutes the surface defining the groove 86, the electrical resistance (the calorific value) is suppressed from changing suddenly and deviations in the electrical resistance (calorific value) of the heater electrode 50 are reduced. Therefore, according to the electrostatic chuck 100 of the present embodiment, it is possible to further effectively increase the controllability of the temperature distribution of the attraction surface S1 of the plate-shaped member 10.

In the electrostatic chuck 100 of the present embodiment, in at least one section that is parallel to the Z-axis direction (for example, a section orthogonal to the extension direction of the heater electrode 50 like the section shown in FIG. 5), the groove 86 has a shape in which a lines constituting the surface defining the groove 86 has only one bending point (corresponding to the deepest portion 85). Since stress tends to concentrate at the bending point, the bending point tends to become a starting point of the crack CR. According to the electrostatic chuck 100 of the present embodiment, since there is only one bending point mentioned above, compared with a structure having a plurality of bending points, it is possible to suppress concentration of stress at each position on the surface defining the groove 86, as a result of which it is possible to suppress occurrence of the crack CR with the surface defining the groove 86 as a starting point.

B. Modifications

The technology that is disclosed in the present description is not limited to the above-described embodiment, and various modifications can be made within a scope that does not depart from the spirit thereof. Examples of possible modifications are as follows.

The structure of the electrostatic chuck 100 in the embodiment above is only one example and can be modified in various ways. For example, the number of heater electrodes 50, the shape of each heater electrode 50, and the disposition of each heater electrode 50 in the plate-shaped member 10 in the embodiment above are only examples and can be modified in various ways. For example, although the electrostatic chuck 100 of the embodiment above includes three heater electrodes 50, the number of heater electrodes 50 of the electrostatic chuck 100 may be two or less or four or more. Similarly, the number of segments Z, the shape of each segment Z, and the disposition of each segment Z in the plate-shaped member 10 in the embodiment above are only examples and can be modified in various ways. The plate-shaped member 10 need not have segments Z.

The number of driver electrodes 60, the shape of each driver electrode 60, and the disposition of each driver electrode 60 in the plate-shaped member 10 in the embodiment above are only examples and can be modified in various ways. In the embodiment above, the electrostatic chuck 100 need not include driver electrodes 60. In the embodiment above, each via may be constituted by a single via or a group of a plurality of vias. In the embodiment above, each via may have a single-layer structure including only a via portion or have a multiple-layer structure (for example, a structure in which a via portion and a pad portion and a via portion are placed upon each other). Although, in the embodiment above, the collar section 109 is formed at the upper portion 101 of the plate-shaped member 10, the collar section 109 may be formed at the lower portion 102 of the plate-shaped member 10. In the embodiment above, the electrostatic chuck 100 need not include an O ring 90. In the embodiment above, the plate-shaped member 10 need not include a collar section 109.

Although, in the embodiment above, a single-pole system in which one chuck electrode 40 is provided in the plate-shaped member 10 is used, a two-pole system in which a pair of chuck electrodes 40 are provided in the plate-shaped member 10 may be used. The material forming each member of the electrostatic chuck 100 of the embodiment above is only an example, and each member may be made of other materials.

Although, in the embodiment above, as the cooling mechanism, the base member 20 has the refrigerant flow path 21 formed in the base member 20, the base member 20 may include other cooling mechanisms (for example, a cooling device disposed at the lower surface of the base member 20).

The shape of the groove 86 in the embodiment above is only an example and can be modified in various ways. For example, although, in the embodiment above, the depth of the groove 86 is a depth that allows the groove 86 to extend through the heater electrode 50 in the thickness direction, the depth of the groove 86 may be shallower. Although, in the embodiment above, in at least one section that is parallel to the Z-axis direction (for example, a section orthogonal to the extension direction of the heater electrode 50 like the section shown in FIG. 5), the groove 86 has a shape whose width becomes narrower with decreasing distance from a deep position, the groove 86 may have a shape whose width is constant or a shape having a portion whose width becomes wider with decreasing distance from the deep position. Although, in the embodiment above, in the section, the groove 86 has a shape in which the line constituting the surface defining the groove 86 has only one bending point, the groove 86 may have a shape in which the line has zero or two or more bending points. Although, in the embodiment above, in the section, the edge portion 88 defining the opening of the groove 86 has a round shape, the edge portion 88 defining the opening of the groove 86 need not have a round shape. Although, in the embodiment above, the insulating material 87 is disposed in the groove 86 formed in the upper surface S4 of the lower portion 102 of the plate-shaped member 10, the insulating material 87 need not be disposed in the groove 86. For example, the inner portion of the groove 86 may be a space (including a vacuum). When a plurality of the grooves 86 are formed in the upper surface S4 of the lower portion 102 of the plate-shaped member 10, not all of the grooves 86 need to have the characteristics described above, and thus at least one of the grooves 86 only need to have the characteristics described above.

Figure 13:
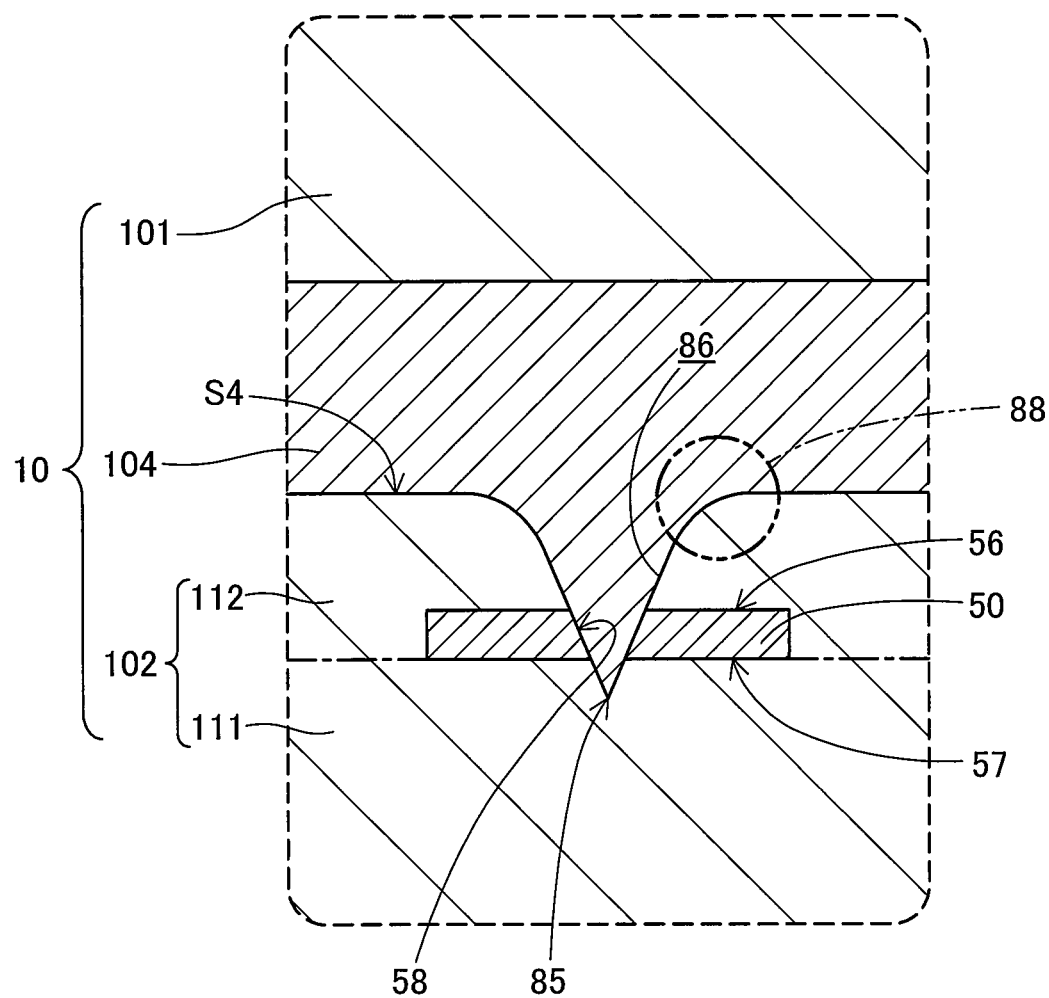
FIG. 13 is an explanatory view showing in detail a structure of a section of a vicinity of a heater electrode 50 in a modification.

As in the modification shown in FIG. 13, a portion of the intermediate joining portion 104 may exist in the groove 86. According to such a modification, since the portion of the intermediate joining portion 104 existing in the groove 86 functions as an anchor, it is possible to increase the joining strength between the upper portion 101 and the lower portion 102 of the plate-shaped member 10 resulting from the intermediate joining portion 104. Although, in the modification shown in FIG. 13, the groove 86 is completely filled with the intermediate joining portion 104, only a portion of the groove 86 (for example, an upper portion of the groove 86) may be filled with the intermediate joining portion 104, and the remaining portion of the groove 86 (for example, a lower portion of the groove 86) need not be filled with the intermediate joining portion 104.

The method of manufacturing the electrostatic chuck 100 in the embodiment above is only an example and can be modified in various ways. For example, at least one step in the method of manufacturing the electrostatic chuck 100 in the embodiment above (for example, the warp correcting step (S160), the thickness measuring step (S170), or the filling step (S220)) may be omitted. When the warp correcting step (S160) is to be performed, one of the first warp correcting step and the second warp correcting step may be omitted.

Although, in the embodiment above, the cover layer 112 is disposed so as to cover the entire upper surface S8 of the particular ceramic green sheet 81 at which the heater pattern 501 is formed, the cover layer 112 only needs to be disposed so as to cover at least the heater pattern 501 and need not necessarily cover the entire upper surface S8 of the particular ceramic green sheet 81. Although, in the embodiment above, the sheet-like cover layer 112 is pressure-bonded to the upper surface S8 of the particular ceramic green sheet 81, the cover layer 112 may be disposed by applying by, for example, screen printing a slurry that is a material of the cover layer 112 to the upper surface S8 of the particular ceramic green sheet 81. Although, in the embodiment above, the cover layer 112 is made of a ceramic, the cover layer 112 may be made of other insulating materials. Note that it is desirable that the material for forming the cover layer 112 be a material whose thermal expansion coefficient is close to that of the material for forming the plate-shaped member 10, have high thermal resistance, be capable of being polished, etc., in addition to having an insulating property.

Although, in the embodiment above, the through hole 84 is formed in the cover layer 112, for example, when the reference pattern 502 is visible through the cover layer 112, the through hole 84 need not be necessarily provided in the cover layer 112. Although, in the embodiment above, the through hole 84 is formed in a position that overlaps the reference pattern 502, a through hole for measuring the thickness of the cover layer 112 may be formed in a position that does not overlap the reference pattern 502.

Figure 14:
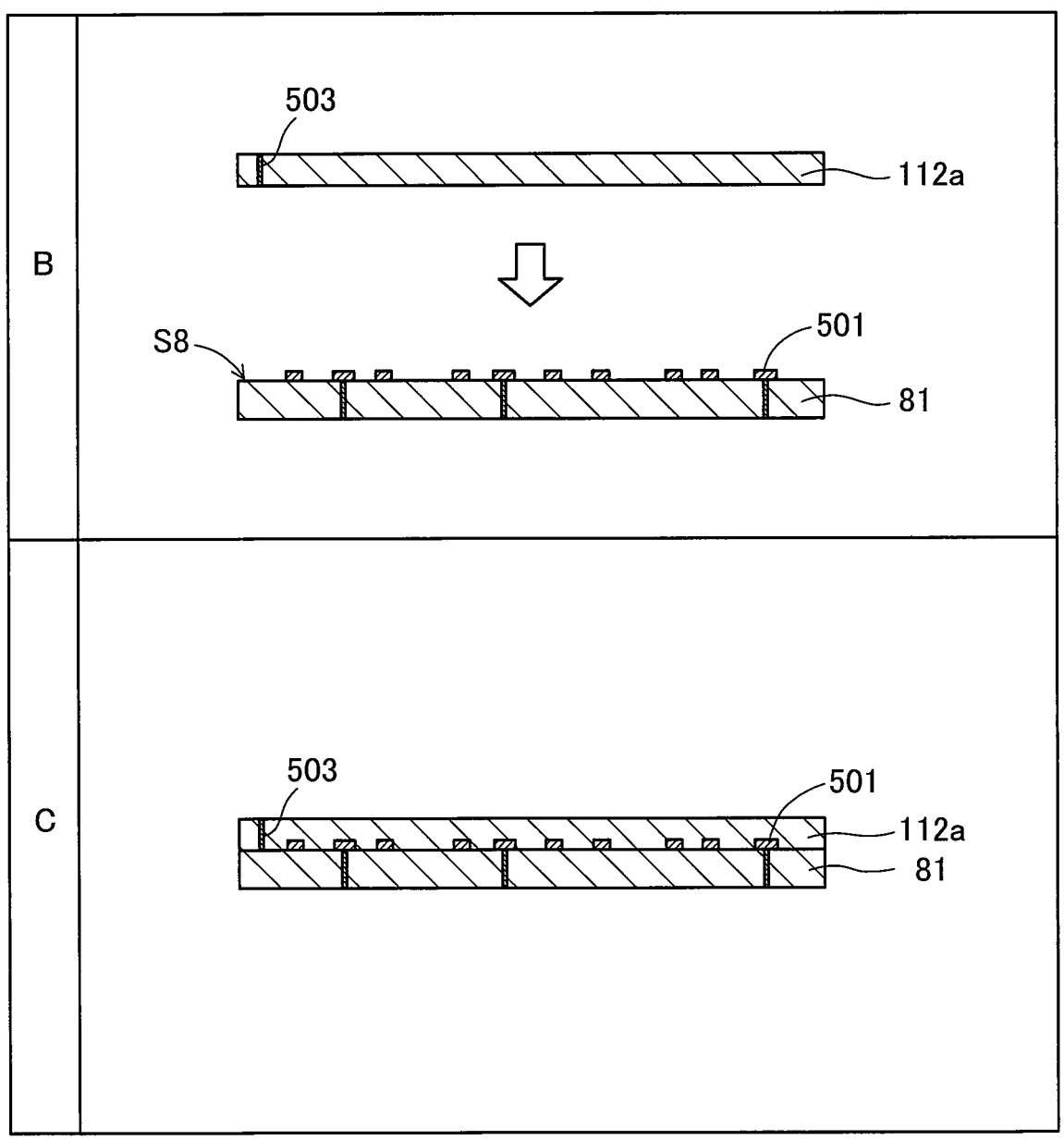
FIG. 14 is an explanatory view illustrating an outline of a method of manufacturing an electrostatic chuck 100 in the modification.

Although, in the embodiment above, the reference pattern 502 is formed on the upper surface S8 of the particular ceramic green sheet 81, the method of forming the reference pattern 502 is not limited thereto. FIG. 14 is an explanatory view illustrating an outline of a method of manufacturing an electrostatic chuck 100 in the modification. In the method of manufacturing the electrostatic chuck 100 of the modification shown in FIG. 14, instead of performing the steps whose outlines are illustrated in sections B and C in FIG. 7 in the method of manufacturing the electrostatic chuck 100 of the embodiment above, the steps whose outlines are illustrated in sections B and C in FIG. 14 are performed. That is, in the method of manufacturing the electrostatic chuck 100 of the modification shown in FIG. 14, a reference pattern 502 is not formed on the upper surface S8 of the particular ceramic green sheet 81. Instead, as illustrated in section B in FIG. 14, a reference pattern 503 is formed in a cover layer 112a. As long as the reference pattern 503 that is formed in the cover layer 112a is visible from a side of an upper surface of the cover layer 112a, the reference pattern 503 can have any form. For example, a via formed in the cover layer 112a can be the reference pattern 503. As illustrated in section C in FIG. 14, by disposing such a cover layer 112a on the particular ceramic green sheet 81, it is possible to cover the heater pattern 501 by the cover layer 112a and manufacture a structure in which the reference pattern 503 is visible from the side of the upper surface of the cover layer 112a.

Although, in the embodiment above, as the insulating material 87 with which the groove 86 and the through hole 84 are filled, a material that is the same as the material of the intermediate joining portion 104 is used, the insulating material 87 is not limited thereto. Any other insulating material (for example, an inorganic adhesive, glass, or a resin adhesive) can be used. The groove 86 and the through hole 84 need not be necessarily filled with the insulating material 87.

In the embodiment above, the layered body 15 constituted by the ceramic green sheets 81 and 82, including the particular ceramic green sheet 81, that are stacked upon each other is manufactured after forming the heater pattern 501 on the particular ceramic green sheet 81. However, the heater pattern 501 may be formed on the surface of the particular ceramic green sheet 81 constituting an upper surface of the layered body 15 after manufacturing the layered body 15 before forming the heater pattern 501.

In the method of manufacturing the electrostatic chuck 100 in the embodiment above, a structure when Step S190 (FIG. 6) has been completed may be prepared by, for example, manufacturing or purchasing the structure, and then, Steps S200 and S210 (or Steps S200 to S220) may be performed. That is, in the method of manufacturing a structure for the holding device (for example, the electrostatic chuck 100) that holds an object (for example, the wafer W) above the lower portion 102 and that includes the lower portion 102 including the lower surface S2 and a portion made of a ceramic, the heater electrodes 50 disposed in the lower portion 102 and formed from a resistance heater, the base member 20 including the cooling mechanism, and the joining portion 30 disposed between the lower surface S2 of the lower portion 102 and the base member 20 and joining the lower portion 102 and the base member 20 to each other, the technology that is disclosed in the present description can also be realized as another form of the method of manufacturing the structure for the holding device. The method of manufacturing the structure for the holding device includes a preparing step of preparing a prior-to-adjustment structure (for example, the structure illustrated in section F in FIG. 9) including the lower portion 102, the heater electrodes 50 covered by the cover layer 112 that is a portion of the lower portion 102, the base member 20, and the joining portion 30 joining the lower portion 102 and the base member 20 to each other; the temperature measuring step of measuring the temperature distribution of the surface (that is, the upper surface S4) on a side opposite to the lower surface S2 of the lower portion 102, while cooling is performed with the cooling mechanism of the base member 20 and electric power is supplied to the heater electrodes 50; and the adjusting step of, based on the result of measurement of the temperature distribution, adjusting the electrical resistance of the heater electrodes 50 by removing a portion of the heater electrodes 50 covered by the cover layer 112 together with the cover layer 112. Note that, in this form, the lower portion 102 of the plate-shaped member 10 is an example of the particular member in the claims, and the lower surface S2 of the lower portion 102 is an example of a particular surface in the claims.

The present invention is not limited to the electrostatic chuck 100 that includes the plate-shaped member 10 and the base member 20 and that holds the wafer W by utilizing an electrostatic attraction force. The present invention is also similarly applicable to other holding devices that hold an object on a surface of a plate-shaped member and that include the plate-shaped member, a base member, a joining portion that joins the plate-shaped member and the base member to each other, and heater electrodes disposed in the plate-shaped member.

REFERENCE SIGNS LIST

10: plate-shaped member
11: upper structure
12: lower structure
13: concave portion
15: layered body
20: base member
21: refrigerant flow path
22: through hole
30: joining portion
32: through hole
40: chuck electrode
41: input pin
42: connector
43: wire section
44: insulating member
50: heater electrode
51: heater line section
52: heater pad section
56: upper surface
57: lower surface
58: side surface
60: driver electrode
71: heater-side via
72: power-supply-side via
73: power-supply electrode
74: power-supply terminal
81: particular ceramic green sheet
82: ceramic green sheet
84: through hole
85: deepest portion
86: groove
87: insulating material
88: edge portion
90: O ring
100: electrostatic chuck
101: upper portion
102: lower portion
104: intermediate joining portion
108: main body section
109: collar section
110: terminal hole
111: substrate layer
112: cover layer
120: hole
501: heater pattern
502: standard pattern
600: driver electrode pair
LB: laser light
LO: laser oscillator
S1: attraction surface
S2: lower surface
S3: upper surface
S4: upper surface
S7: lower surface
S8: upper surface
VL: virtual dividing line
W: wafer
Z: segment

What is claimed is:

1. A holding device that holds an object on a first surface of a plate-shaped member, the holding device comprising:
the plate-shaped member that has the first surface substantially orthogonal to a first direction and a second surface on a side opposite to the first surface, the plate-shaped member including a first portion that includes the first surface and a fifth surface on a side opposite to the first surface, a second portion that includes the second surface, a fourth surface facing the fifth surface, and a portion made of a ceramic, and a first joining portion that is disposed between the fifth surface and the fourth surface, and that joins the fifth surface and the fourth surface to each other;

a heater electrode that is disposed at the second portion of the plate-shaped member and that is formed from a resistance heater;

a base member that has a third surface, that is disposed so that the third surface is positioned on a side of the second surface of the plate-shaped member, and that includes a cooling mechanism; and a second joining portion that is disposed between the second surface of the plate-shaped member and the third surface of the base member, and that joins the plate-shaped member and the base member to each other, wherein a groove at which a portion of a surface defining the groove is constituted by a portion of a surface of the heater electrode is formed in the fourth surface among surfaces of the second portion of the plate-shaped member, and wherein when electric power is supplied to the heater electrode and cooling is performed with the cooling mechanism, and when a difference between a temperature of the heater electrode and a temperature of the cooling is greater than or equal to 50° C., a difference between a maximum value and a minimum value of a temperature at the first surface is less than or equal to 3.5° C.

2. The holding device according to claim 1, wherein, in at least one section that is parallel to the first direction, an edge portion defining an opening of the groove has a round shape.

3. The holding device according to claim 1, wherein, in at least one section that is parallel to the first direction, the groove has a shape in which a depth of a deepest portion is deeper than a maximum value of a distance in the first direction from a portion of the fourth surface other than the groove to each position on a surface of the heater electrode.

4. The holding device according to claim 1, wherein, in at least one section that is parallel to the first direction, the groove has a shape whose width in a direction orthogonal to the first direction becomes narrower with decreasing distance from a deep position.

5. The holding device according to claim 1, wherein, in at least one section that is parallel to the first direction, the groove has a shape in which a line constituting a surface defining the groove has no more than one bending point.

6. The holding device according to claim 1, wherein a portion of the first joining portion exists in the groove.

* * * * *